United States Patent
Li

(10) Patent No.: US 12,185,615 B2
(45) Date of Patent: Dec. 31, 2024

(54) GREEN QUANTUM DOT LIGHT EMITTING DEVICE, METHOD FOR MANUFACTURING THE SAME, AND DISPLAY APPARATUS

(71) Applicants: Beijing BOE Technology Development Co., Ltd., Beijing (CN); BOE Technology Group Co., Ltd., Beijing (CN)

(72) Inventor: Dong Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/756,178

(22) PCT Filed: Mar. 11, 2021

(86) PCT No.: PCT/CN2021/080313
§ 371 (c)(1),
(2) Date: May 18, 2022

(87) PCT Pub. No.: WO2022/188113
PCT Pub. Date: Sep. 15, 2022

(65) Prior Publication Data
US 2024/0164187 A1    May 16, 2024

(51) Int. Cl.
*H01L 23/00* (2006.01)
*H10K 50/15* (2023.01)
(Continued)

(52) U.S. Cl.
CPC ......... *H10K 59/876* (2023.02); *H10K 50/156* (2023.02); *H10K 50/16* (2023.02);
(Continued)

(58) Field of Classification Search
None
See application file for complete search history.

(56) References Cited

U.S. PATENT DOCUMENTS

2021/0288281 A1    9/2021    Li et al.

FOREIGN PATENT DOCUMENTS

| CN | 103904178 A | 7/2014 |
| CN | 104091895 A | 10/2014 |

(Continued)

OTHER PUBLICATIONS

International Search Report and Written Opinion received for PCT Patent Application No. PCT/CN2021/080313, mailed on Nov. 25, 2021, 8 pages (2 pages of English Translation and 6 pages of Original Document).

*Primary Examiner* — Anthony Ho
(74) *Attorney, Agent, or Firm* — Workman Nydegger

(57) ABSTRACT

Embodiments of the present disclosure disclose a green quantum dot light-emitting device, a method for manufacturing the same, and a display apparatus, including: a first cathode and a first anode opposite to each other, a green quantum dot light-emitting layer between the first cathode and the first anode, a first electron transport layer between the first cathode and the green quantum dot light-emitting layer, and a first hole transport layer between the green quantum dot light-emitting layer and the first anode; wherein a material of the first electron transport layer includes an oxide containing Zn, a thickness of the first electron transport layer is in the range of 10 nm to 40 nm, and a thickness of the first hole transport layer is in the range of 26 nm to 39 nm.

20 Claims, 14 Drawing Sheets

(51) Int. Cl.
  *H10K 50/16* (2023.01)
  *H10K 59/80* (2023.01)
  *H10K 71/10* (2023.01)
  *H10K 50/115* (2023.01)
  *H10K 59/35* (2023.01)
  *H10K 101/40* (2023.01)
  *H10K 102/00* (2023.01)

(52) U.S. Cl.
  CPC ........... *H10K 71/10* (2023.02); *H10K 50/115* (2023.02); *H10K 59/35* (2023.02); *H10K 2101/40* (2023.02); *H10K 2102/351* (2023.02)

(56) References Cited

FOREIGN PATENT DOCUMENTS

| | | |
|---|---|---|
| CN | 105261707 A | 1/2016 |
| CN | 107785496 A | 3/2018 |
| CN | 108735905 A | 11/2018 |
| CN | 109980108 A | 7/2019 |
| CN | 109994502 A | 7/2019 |
| CN | 110165066 A | 8/2019 |
| CN | 110299437 A | 10/2019 |
| CN | 110299461 A | 10/2019 |
| CN | 110896130 A | 3/2020 |
| CN | 111864086 A | 10/2020 |
| WO | 2016/000337 A1 | 1/2016 |

GREEN QUANTUM DOT LIGHT EMITTING DEVICE, METHOD FOR MANUFACTURING THE SAME, AND DISPLAY APPARATUS

The present application is a National Stage of International Application No. PCT/CN2021/080313, filed on Mar. 11, 2021, the entire contents of which are incorporated herein by reference.

FIELD

The present disclosure relates to the field of display technology, and in particular to a green quantum dot light-emitting device, a method for manufacturing the same, and a display apparatus.

BACKGROUND

As a new type of light-emitting materials, Quantum Dot (QD) has the advantages of high light color purity, high light-emitting quantum efficiency, adjustable light-emitting color, long service life, and the like, and has become a research hotspot of light-emitting materials in current new light-emitting diodes. Therefore, Quantum Dot Light Emitting Diodes (QLEDs) using quantum dot materials as a light-emitting layer have become the main research direction of current new display devices.

SUMMARY

A green quantum dot light-emitting device provided by an embodiment of the present disclosure includes: a first cathode and a first anode opposite to each other, a green quantum dot light-emitting layer between the first cathode and the first anode, a first electron transport layer between the first cathode and the green quantum dot light-emitting layer, and a first hole transport layer between the green quantum dot light-emitting layer and the first anode; wherein a material of the first electron transport layer includes an oxide containing Zn, a thickness of the first electron transport layer is in a range of 10 nm to 40 nm, and a thickness of the first hole transport layer is in a range of 26 nm to 39 nm.

Optionally, in the above green quantum dot light-emitting device provided by the embodiment of the present disclosure, the first cathode includes a reflective film layer, and the first anode includes a transflective film layer; or, the first cathode includes a transflective film layer, and the first anode includes a reflective film layer.

Optionally, in the above green quantum dot light-emitting device provided by the embodiment of the present disclosure, the green quantum dot light-emitting device is provided with a top emission structure.

Optionally, in the above green quantum dot light-emitting device provided by the embodiment of the present disclosure, the green quantum dot light-emitting device is provided with an inverted structure, and the green quantum dot light-emitting device further includes a substrate on one side of the first cathode away from the green quantum dot light-emitting layer.

Optionally, in the above green quantum dot light-emitting device provided by the embodiment of the present disclosure, a thickness of the first electron transport layer is 30 nm, and a thickness of the first hole transport layer is 30 nm.

Optionally, in the above green quantum dot light-emitting device provided by the embodiment of the present disclosure, the material of the first electron transport layer is $Zn_{1-x}Mg_xO$, wherein x is in a range of 0 to 0.2.

Optionally, in the above green quantum dot light-emitting device provided by the embodiment of the present disclosure, x is equal to 0.15.

Optionally, in the above green quantum dot light-emitting device provided by the embodiment of the present disclosure, a material of the first hole transport layer includes an organic material or an inorganic material, wherein the organic material includes polyvinylcarbazole, or poly(9,9-dioctylfluorene-alt-N-(4-sec-butylphenyl)-diphenylamine), or N,N'-diphenyl-N,N'-bis(3-methylbenzene)-(1,1'-biphenyl)-4,4'-diamine, or 4,4',4"-tris(carbazol-9-yl)triphenylamine or N,N'-diphenyl-N,N'-bis(1-naphthyl)-1,1'-biphenyl-4-4"-diamine, and the inorganic material includes NiOx or VOx.

Optionally, in the above green quantum dot light-emitting device provided by the embodiment of the present disclosure, the first hole transport layer includes a first sub hole transport layer and a second sub hole transport layer laminated with each other, the first sub hole transport layer is close to the green quantum dot light-emitting layer, the second sub hole transport layer is away from the green quantum dot light-emitting layer, and a highest occupied molecular orbit (HOMO) energy level of the first sub hole transport layer is smaller than an HOMO energy level of the second sub hole transport layer.

Optionally, in the above green quantum dot light-emitting device provided by the embodiment of the present disclosure, the HOMO energy level of the first sub hole transport layer is in a range of −5.5 eV to −6.2 eV, and the HOMO energy level of the second sub hole transport layer is in a range of −5.3 eV to −5.0 eV.

Optionally, in the above green quantum dot light-emitting device provided by the embodiment of the present disclosure, a material of the first sub hole transport layer is 4,4',4"-tris(carbazol-9-yl)triphenylamine, and a material of the second sub hole transport layer is N,N'-diphenyl-N,N'-bis(1-naphthyl)-1,1'-biphenyl-4-4'-diamine.

Optionally, in the above green quantum dot light-emitting device provided by the embodiment of the present disclosure, a thickness of the first sub hole transport layer is in a range of 4 nm to 15 nm, and a thickness of the second sub hole transport layer is in a range of 20 nm to 35 nm.

Optionally, the above green quantum dot light-emitting device provided by the embodiment of the present disclosure, further includes a first hole injection layer between the first hole transport layer and the first anode, and a thickness of the first hole injection layer is in a range of 1 nm to 10 nm.

Optionally, in the above green quantum dot light-emitting device provided by the embodiment of the present disclosure, the thickness of the first hole injection layer is 5 nm.

Optionally, in the above green quantum dot light-emitting device provided by the embodiment of the present disclosure, the first cathode includes a metal layer and a transparent conductive layer laminated with each other, a material of the metal layer includes Al or Ag or Ti or Mo, a thickness of the metal layer is in a range of 60 nm to 150 nm, a material of the transparent conductive layer is indium tin oxide or fluorine-doped $SnO_2$ or a conductive polymer, and a thickness of the transparent conductive layer is in a range of 5 nm to 50 nm.

Optionally, in the above green quantum dot light-emitting device provided by the embodiment of the present disclosure, a material of the first anode includes Al or Ag or Mg/Ag alloy, and a thickness of the first anode is in a range of 10 nm to 20 nm; or the material of the first anode includes indium tin oxide, or indium zinc oxide, or zinc gallium oxide, or indium gallium zinc oxide, and the thickness of the first anode is in a range of 40 nm to 200 nm.

Optionally, in the above green quantum dot light-emitting device provided by the embodiment of the present disclosure, the thickness of the green quantum dot light-emitting layer is in a range of 10 nm to 40 nm.

Optionally, in the above green quantum dot light-emitting device provided by the embodiment of the present disclosure, a material of the green quantum dot light-emitting layer includes one of CdS, CdSe, ZnSe, InP, PbS, $CsPbCl_3$, $CsPbBr_3$, $CsPbI_3$, CdS/ZnS, CdSe/ZnSe, CdSe/ZnS, ZnSe, InP/ZnS, PbS/ZnS, $CsPbCl_3$/ZnS, $CsPbBr_3$/ZnS or $CsPhI_3$/ZnS.

Optionally, the above green quantum dot light-emitting device provided by the embodiment of the present disclosure, further includes a light extraction layer on one side of the first anode away from the green quantum dot light-emitting layer, a material of the light extraction layer is an organic material, and a thickness of the light extraction layer is in a range of 60 nm to 130 nm.

Accordingly, an embodiment of the present disclosure further provides a display apparatus, including a red quantum dot light-emitting device, a green quantum dot light-emitting device and a blue quantum dot light-emitting device, wherein the green quantum dot light-emitting device is any of the above green quantum dot light-emitting device.

Optionally, in the above display apparatus provided by the embodiment of the present disclosure, the red quantum dot light-emitting device includes: a second cathode and a second anode opposite to each other, a red quantum dot light-emitting layer between the second cathode and the second anode, a second electron transport layer between the second cathode and the red quantum dot light-emitting layer, and a second hole transport layer between the red quantum dot light-emitting layer and the second anode.

Optionally, in the above display apparatus provided by the embodiment of the present disclosure, the blue quantum dot light-emitting device includes: a third cathode and a third anode opposite to each other, a blue quantum dot light-emitting layer between the third cathode and the third anode, a third electron transport layer between the third cathode and the blue quantum dot light-emitting layer, and a third hole transport layer between the blue quantum dot light-emitting layer and the third anode.

Optionally, in the above display apparatus provided by the embodiment of the present disclosure, a sum of a thickness of the second electron transport layer and a thickness of the second hole transport layer, a sum of a thickness of the first electron transport layer and a thickness of the first hole transport layer, and a sum of a thickness of the third electron transport layer and a thickness of the third hole transport layer gradually decrease.

Optionally, in the above display apparatus provided by the embodiment of the present disclosure, a thickness of the second electron transport layer, the thickness of the first electron transport layer, and a thickness of the third electron transport layer gradually decrease; and/or a thickness of the second hole transport layer, a thickness of the first hole transport layer, and a thickness of the third hole transport layer gradually decrease.

Optionally, in the above display apparatus provided by the embodiment of the present disclosure, a thickness of the second electron transport layer is in a range of 35 nm to 60 nm, and a thickness of the second hole transport layer is in a range of 35 nm to 65 nm.

Optionally, in the above display apparatus provided by the embodiment of the present disclosure, a thickness of the second electron transport layer is in a range of 37.5 nm to 42.5 nm, and a thickness of the second hole transport layer is in a range of 42.5 nm to 47.5 nm.

Optionally, in the above display apparatus provided by the embodiment of the present disclosure, a thickness of the third electron transport layer is in a range of 10 nm to 30 nm, and a thickness of the third hole transport layer is in a range of 10 nm to 30 nm.

Optionally, in the above display apparatus provided by the embodiment of the present disclosure, a thickness of the third electron transport layer is in a range of 15 nm to 25 nm, and a thickness of the third hole transport layer is in a range of 10 nm to 20 nm.

Optionally, in the above display apparatus provided by the embodiment of the present disclosure, the red quantum dot light-emitting device, the blue quantum dot light-emitting device and the green quantum dot light-emitting device are provided with the same structure.

Optionally, in the above display apparatus provided by the embodiment of the present disclosure, material components of electron transport layers and/or hole transport layers in the red quantum dot light-emitting device, the green quantum dot light-emitting device and the blue quantum dot light-emitting device are the same.

Accordingly, an embodiment of the present disclosure further provides a method for manufacturing the above green quantum dot light-emitting device, including: manufacturing the first cathode and the first anode opposite to each other, manufacturing the light-emitting layer between the first cathode and the first anode, manufacturing the first electron transport layer between the first cathode and the green quantum dot light-emitting layer, and manufacturing the first hole transport layer between the green quantum dot light-emitting layer and the first anode; wherein a material of the first electron transport layer includes an oxide containing Zn, a thickness of the first electron transport layer is in a range of 10 nm to 40 nm, and a thickness of the first hole transport layer is in a range of 26 nm to 39 nm.

Optionally, in the above method provided by the embodiment of the present disclosure, the manufacturing the first cathode and the first anode opposite to each other, manufacturing the light-emitting layer between the first cathode and the first anode, manufacturing the first electron transport layer between the first cathode and the green quantum dot light-emitting layer, and manufacturing the first hole transport layer between the green quantum dot light-emitting layer and the first anode includes: manufacturing the first cathode on a substrate; manufacturing the first electron transport layer on one side of the first cathode away from the substrate; manufacturing the light-emitting layer on one side of the first electron transport layer away from the substrate; manufacturing the first hole transport layer on one side of the green quantum dot light-emitting layer away from the substrate; and manufacturing the first anode on one side of the first hole transport layer away from the substrate.

Optionally, the above method provided by the embodiment of the present disclosure, further includes: manufacturing a first hole injection layer between the first hole transport layer and the first anode.

DETAILED DESCRIPTION OF THE EMBODIMENTS

Figure 1:
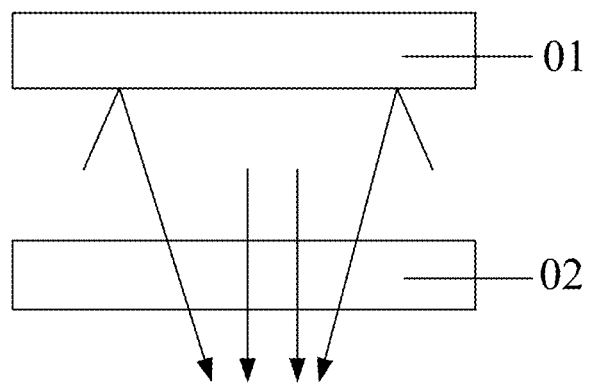
FIG. 1 is a schematic diagram of light emitting corresponding to a bottom emission structure.

In order to make the objective, technical solutions and advantages of the embodiments of the present disclosure more clear, the technical solutions of the embodiments of the present disclosure will be described clearly and completely with reference to the drawings of the embodiments of the present disclosure. Obviously, the described embodiments are part of the embodiments of the present disclosure, but not all the embodiments. The embodiments in the present disclosure and features in the embodiments may be mutually combined in the case of no conflict. On the basis of the described embodiments of the present disclosure, all other embodiments obtained by those ordinarily skilled in the art without inventive efforts fall within the protection scope of the present disclosure.

Unless otherwise defined, the technical or scientific terms used in the present disclosure shall have the usual meanings understood by a person of ordinary skill in the art to which the present disclosure belongs. The word "including" or "containing" and the like used in the present disclosure, means that an element or item preceding the word covers an element or item listed after the word and the equivalent thereof, without excluding other elements or items. The word "connection" or "coupling" and the like is not restricted to physical or mechanical connection, but may include electrical connection, whether direct or indirect. The words "inner", "outer", "up", "down" and the like are only configured to indicate the relative positional relationship. When the absolute position of the described object changes, the relative positional relationship may also change accordingly.

It should be noted that the sizes and shapes of all graphs in the drawings do not reflect the true scale, and only intend to illustrate the content of the present disclosure. The same or similar reference numbers represent the same or similar elements or elements with the same or similar functions from beginning to end.

At present, active matrix quantum dot light-emitting display products (AMQLED) have also received more and more attention due to their potential advantages in wide color gamut and high lifetime. Its research is increasingly in-depth, the quantum efficiency is continuously improved, and basically reaches the level of industrialization. It has become a future trend to further adopt new processes and technologies to realize its industrialization. But whether it is an upright or an inverted device, carrier balance is a factor that affects the device efficiency.

In a QLED device, due to an energy level position, a mobility and other reasons, electron injection of red and green quantum dot materials is generally better than hole injection, and electrons dominate the number of carriers, while the electron injection of blue quantum dot materials is weaker than hole injection, and the carriers in the device are very unbalanced, which becomes a bottleneck limiting the further improvement of the efficiency and stability of a QLED device. Especially for small-sized display products, unbalanced carrier injection in the device will affect a light emitting angle and intensity of the display product.

At present, most of research on QLED is a bottom emission structure. The demand for high resolution in high-resolution display products requires the QLED device to adopt a top emission structure, which may increase an aperture ratio.

A QLED device that may be implemented is shown in FIG. 1, which may include a top electrode 01 and a bottom electrode 02 opposite to each other and a light-emitting functional layer (not shown) between the top electrode 01 and the bottom electrode 02. The top electrode 01 completely reflects light, and the bottom electrode 02 is a transparent film layer which may almost completely transmit the light. Part of the light emitted from the light-emitting functional layer is approximately directly emitted through the bottom electrode 02, and the other part is approximately directly emitted after being reflected by the top electrode 01. This bottom emission structure may directly examine the carrier injection balance of the device.

Figure 2:
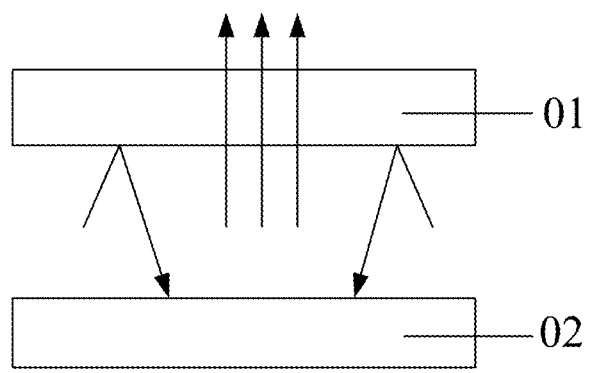
FIG. 2 is a schematic diagram of light emitting corresponding to a top emission structure.

A QLED device structure that may be implemented may be, for example, as shown in FIG. 2. The bottom electrode 02 (e.g., Ag/ITO) is provided with a function of reflecting light, and the top electrode 01 (e.g., thin Ag layer) is provided with a transflective property. After the light emitted by a light-emitting layer 03 passes through the top electrode 01, part of the light is emitted and part of the light is reflected. This QLED device structure may be regarded as a Fabry-Perot cavity, that is, an emitter is between a bottom reflective mirror (bottom electrode) formed by the bottom electrode and a top semi-transparent mirror (top electrode) formed by the top electrode. In such cavity, two kinds of interference may be found: (1) interference between directly emitted light and light with the same wave vector reflected from a bottom mirror (wide-angle interference) and (2) interference among light reflected for multiple times by the bottom mirror and the top mirror (multi-beam interference).

In a cavity model, emitted irradiance may be expressed as:

$$I(\lambda, \theta) = \frac{T_t\left[1 + R_b + 2\sqrt{R_b}\cos\left(-\phi_b + \frac{4\pi n(\lambda)d'\cos(\theta'_{EML})}{\lambda}\right)\right]}{\left(1 - \sqrt{R_b R_t}\right)^2 + 4\sqrt{R_b R_t}\sin^2\left(\frac{\Delta\phi}{2}\right)} I_0(\lambda). \quad (1)$$

In the formula, $\lambda$ is an emission wavelength, $\Theta$ is an emission angle in air, $T_t$ is a transmittance of the top electrode, $R_t$ is a reflectance of the top electrode, $R_b$ is a reflectance of the bottom electrode, $\theta'_{EML}$ is a light propagation angle in an organic layer controlled by a Snell's law, $\phi_b$ is phase shift at the bottom electrode, n ($\lambda$) is a relationship of a refractive index of a material and a wavelength, $\Delta\phi$ is the phase shift after one period, and $I_0(\lambda)$ is an intrinsic PL spectral intensity of radiating molecules, and d' is a distance between the radiating molecules to a high reflective mirror.

In addition, phase shift of light after one period in the cavity is given by the following formula:

$$\Delta\phi = -\phi_b + \sum_i \frac{4\pi n'_i(\lambda)d'_i\cos(\theta'_i)}{\lambda} \quad (2)$$

$$\Delta\phi = -\phi_b - \phi_t + \sum_i \frac{4\pi n_i(\lambda)d_i\cos(\theta'_i)}{\lambda}. \quad (3)$$

In the formula, $\phi_b$ is the phase shift at the bottom electrode, $\phi_t$ is the phase shift at the top electrode, $n'_i(\lambda)$ and are a refractive index and thickness from a light-emitting molecule to the high reflective mirror layer, $n_i(\lambda)$ and d, are refractive indices and thicknesses of all layers in the cavity. The formula (2) and formula (3) represent two kinds of interference, wide-angle interference and multi-beam interference, respectively.

A resonance condition should be determined at $\Delta\phi=2\pi m$ (m=0, 1, 2 . . . ). If the resonance condition is met, constructive interference occurs, resulting in enhanced emission. It may be easily seen from the above equations that the resonance condition is related to the emission wavelength of the emitter, an optical length of the cavity (a thickness of each layer), the refractive index of each layer, a position of the emitter relative to the refractive mirror and the semi-transparent mirror in the cavity and the emission angle. If the resonance condition is not met, emission of a microcavity is suppressed.

From the above equation, as long as the intrinsic PL spectral intensity $I_0(\lambda)$, the optical length of the cavity, and the distance from the light-emitting position to the reflective bottom electrode are given, we may also calculate the irradiance intensity related to the emission angle I ($\theta$) through an equation (4):

$$I(\theta)=\Sigma_i I(\lambda_i,\theta) \quad (4).$$

To sum up, it may be seen from the above formula that for the top emission QLED device shown in FIG. 2, the stronger vertical emission in the QLED device is mainly related to the thickness and refractive index of each film layer. Since the range of the refractive index of each film layer in the QLED device is fixed, to realize stronger vertical emission in the QLED device, we need to optimize the thicknesses of the film layers in the QLED device.

Figure 3:
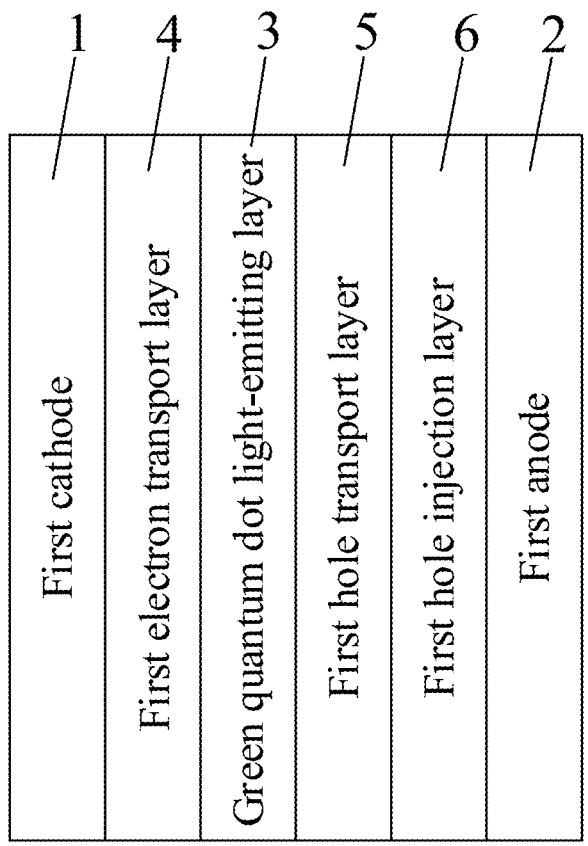
FIG. 3 is a schematic structural diagram of a green quantum dot light-emitting device with an inverted structure provided by an embodiment of the present disclosure.

In view of this, an embodiment of the present disclosure provides a green quantum dot light-emitting device, as shown in FIG. 3, including: a first cathode 1 and a first anode 2 opposite to each other, a green quantum dot light-emitting layer 3 between the first cathode 1 and the first anode 2, a first electron transport layer 4 between the first cathode 1 and the green quantum dot light-emitting layer 3, and a first hole transport layer 5 between the green quantum dot light-emitting layer 3 and the first anode 2.

A material of the first electron transport layer 4 includes an oxide containing Zn, a thickness of the first electron transport layer 4 is in a range of 10 nm to 40 nm, and a thickness of the first hole transport layer 5 is in a range of 26 nm to 39 nm.

In the above green quantum dot light-emitting device provided by the embodiment of the present disclosure, the first cathode 1 includes an opaque film layer, and the first anode 2 includes a transflective film layer; or, the first cathode 1 includes a transflective film layer, and the first anode 2 includes an opaque film layer. In this way, an optical cavity may be generated between the first cathode 1 and the first anode 2, thereby regulating and controlling a light emitting angle of the green quantum dot light-emitting device.

Preferably, in the above green quantum dot light-emitting device provided by the embodiment of the present disclosure, the first cathode 1 includes a reflective film layer, and the first anode 2 includes a transflective film layer; or, the first cathode 1 includes a transflective film layer, and the first anode 2 includes a reflective film layer. The reflective film layer is an opaque film layer and may reflect light. In this way, a Fabry-Perot cavity resonance may be better formed between the first cathode 1 and the first anode 2, thereby better regulating and controlling the light emitting angle of the green quantum dot light-emitting device. During specific implementation, a material of the transflective film layer may include Al, Ag or Mg/Ag alloy, and a thickness of the transflective film layer may be in a range of 10 nm to 20 nm; or a material of the transflective film layer includes indium tin oxide, indium zinc oxide, zinc gallium oxide or indium gallium zinc oxide, and the thickness of the first anode is in a range of 40 nm to 200 nm. During specific implementation, a material of a reflective layer may include Al, Ag, Ti or Mo, more preferably Ag; and a thickness of the reflective layer is preferably in a range of 60 nm to150 nm.

During specific implementation, in the above green quantum dot light-emitting device provided by the embodiment of the present disclosure, a refractive index of each film layer will affect a light emitting effect of the green quantum dot light-emitting device, for example, the light emitting angle. Optionally, a refractive index of green quantum dots for visible light is in a range of 1.7 to 2, and the range adopted by the embodiment of the present disclosure is 1.78 to 1.94. A refractive index of the first electron transport layer for visible light is in a range of 1.2 to 1.6, and the range adopted by the embodiment of the present disclosure is 1.25 to 1.51. A refractive index of the first hole transport layer for visible light is in a range of 1.8 to 2.2, and the range adopted by the embodiment of the present disclosure is 1.9 to 2.1. A refractive index of the first hole injection layer for visible light is in a range of 1.7 to 2.2, and the range adopted by the embodiment of the present disclosure is 1.8 to 2.

Figure 4:
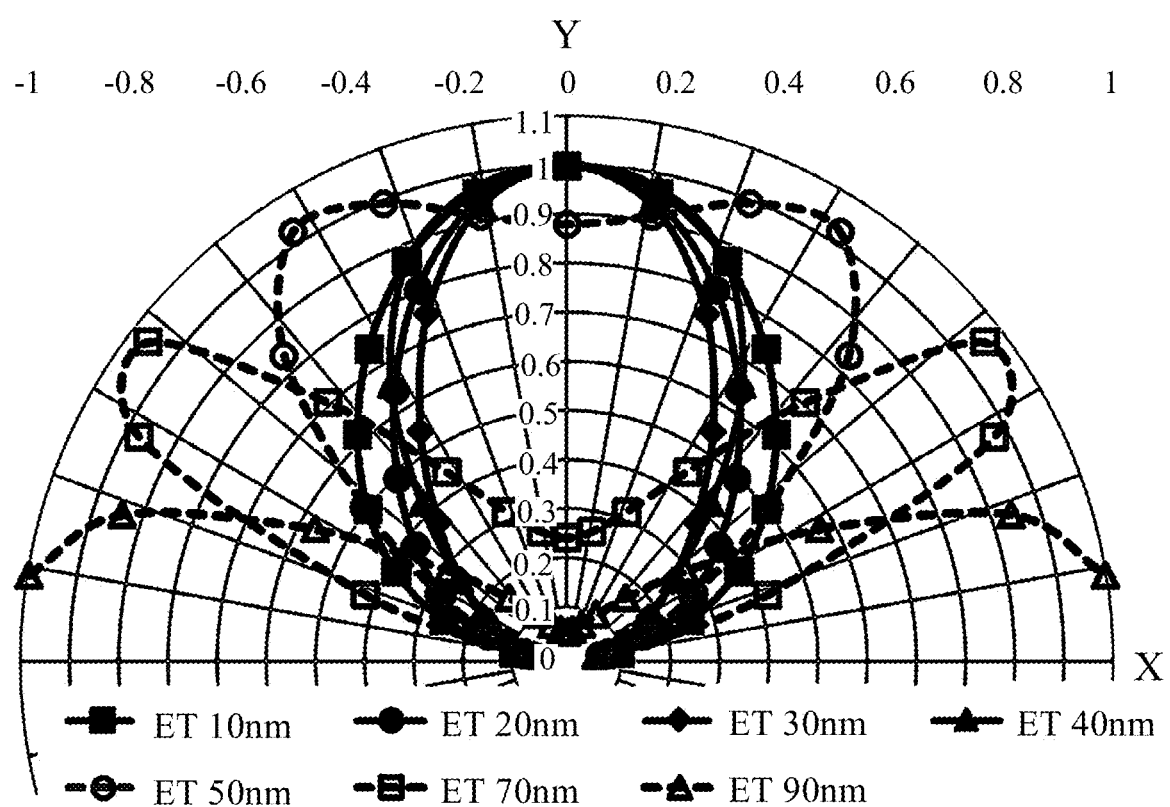
FIG. 4 is a schematic diagram of light emitting angle distribution corresponding to different first electron transport layers.
Figure 5:
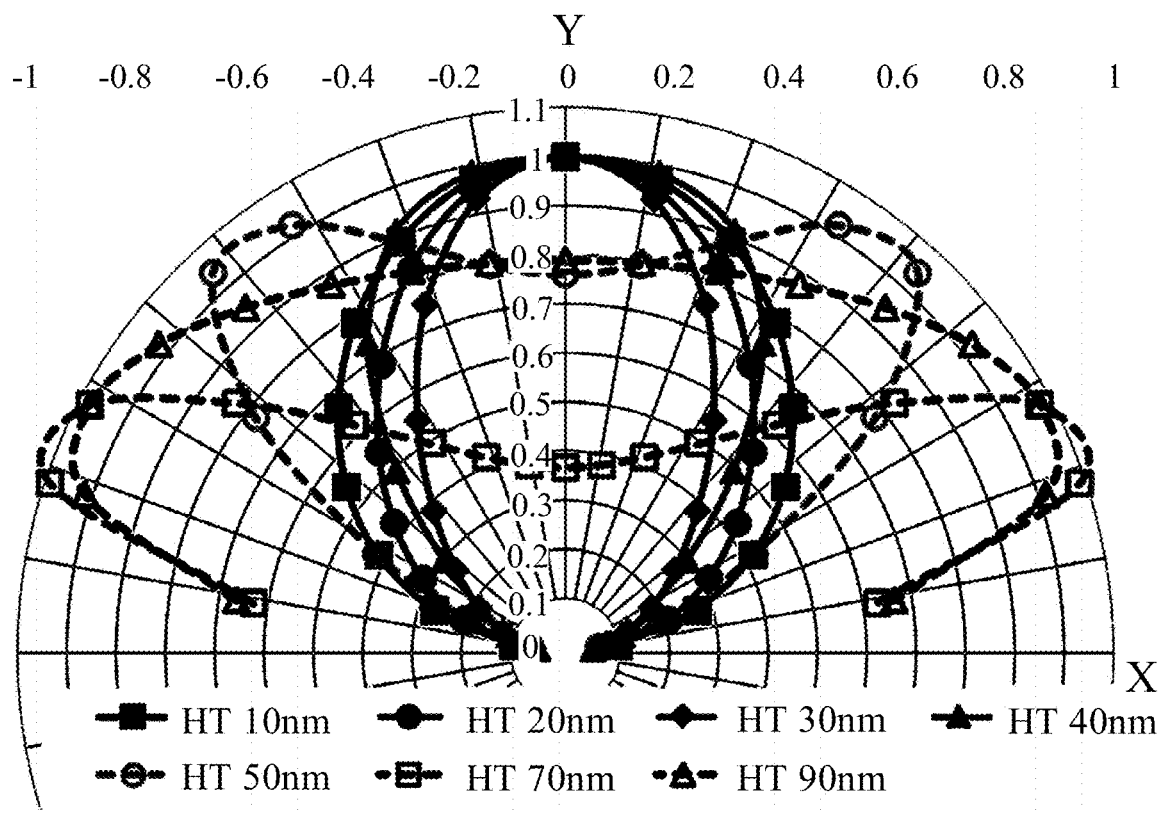
FIG. 5 is a schematic diagram of light emitting angle distribution corresponding to different first hole transport layers.

Based on the refractive indices of these film layers adopted in the embodiment of the present disclosure, light emitting angle distributions of inverted top-emitting green quantum dot light-emitting devices corresponding to the first electron transport layer and the first hole transport layer with different thicknesses are simulated in the embodiment of the present disclosure. Simulation results are shown in FIG. 4 and FIG. 5. For the inverted top-emitting green quantum dot light-emitting device, the first cathode 1 includes a reflective film layer, the first anode 2 includes a transflective film layer, and the device emits light from one side of first anode 2. FIG. 4 is simulation results corresponding to the first electron transport layers (represented by ET) with different thicknesses, and the thickness of the first hole transport layer is 30 nm. FIG. 5 is simulation results corresponding to the first hole transport layers (represented by HT) with different thicknesses, and the thickness of the first electron transport layer is 30 nm. A distance from each point in curves in FIG. 4 and FIG. 5 to an original point represents a light emitting intensity I at an angle θ, and its coordinates are represented by (I cos θ, I sin θ), and an included angle between a line connecting the point with the original point and an X-axis is the light emitting angle θ. FIG. 4 and FIG. 5 respectively illustrate show the light emitting angle distribution results when the first electron transport layer (represented by ET) and the first hole transport layer (represented by HT) are respectively in a range of 10 nm to 90 nm. It may be seen that when the thicknesses of the first electron transport layer (represented by ET) and the first hole transport layer (represented by HT) are respectively in a range of 10 nm to 40 nm, the light emitting angle distribution of the inverted top-emitting green quantum dot light-emitting device is narrowed, and the light emitting intensity is concentrated on the front side of the screen (normal direction). More preferably, in the embodiment of the present disclosure, in order to further obtain a green quantum dot light-emitting device whose light intensity is concentrated on the front side of the screen, the thickness of the first hole transport layer (represented by HT) is preferably in a range of 26 nm to 39 nm.

Therefore, in the above green quantum dot light-emitting device provided by the embodiment of the present disclosure, the material of the first electron transport layer 4 adopts an oxide containing Zn, the thickness of the first electron transport layer 4 is preferably in a range of 10 nm to 40 nm, and the thickness of the first hole transport layer 5 is preferably in a range of 26 nm to 39 nm. In the present disclosure, by optimizing the thicknesses of the first electron transport layer 4 and the first hole transport layer 5, a current efficiency of the green quantum dot light-emitting device is improved, and the front-side light emitting intensity of the green quantum dot light-emitting device is improved, the light-emitting angle distribution is narrowed, and the light-emitting intensity is concentrated on the front side of the screen (normal direction).

The quantum dot light-emitting device may be either provided with a top emission structure or a bottom emission structure. The difference between the top emission structure and the bottom emission structure is the light of the device is emitted through a substrate or emitted in a direction away from the substrate. For the bottom emission structure, the light of the device is emitted through the substrate. An electrode (bottom electrode) close to the substrate includes a transparent film layer or a transflective film layer, which may allow light to pass through. An electrode (top electrode) on the same side as the bottom electrode relative to the substrate and away from the substrate includes an opaque film layer (preferably, a reflective film layer). For the top emission structure, the light of the device is emitted in the direction away from the substrate. The electrode (bottom electrode) close to the substrate includes an opaque film layer (preferably, a reflective film layer). The electrode (top electrode) on the same side as the bottom electrode relative to the substrate and away from the substrate includes a transparent film layer or a transflective film layer, which may allow light to pass through. When designing the quantum dot light-emitting device with the optical cavity (for example, an F-P cavity), the top emission structure is easier to prepare due to the need to set an electrode structure including a transflective film layer. Therefore, in addition to considering an aperture ratio, the process difficulty is also consideration for preferred top emission for the quantum dot light-emitting device.

The quantum dot light-emitting device may be of an upright structure or an inverted structure. The difference between the upright structure and the inverted structure is that the film layers are manufactured in different orders. The upright structure is to sequentially form the first cathode, the first electron transport layer, the light-emitting layer, the first hole transport layer, the first hole injection layer and the first anode on the substrate, and the inverted structure is to sequentially form the first anode, the first hole injection layer, the first hole transport layer, the light-emitting layer, the first electron transport layer and first cathode on the substrate. For the inverted structure, the hole transport layer and the hole injection layer may be deposited with various small molecular materials by evaporation. Compared with the upright structure, the inverted structure has a larger material selection scope. This is because in the upright quantum dot light-emitting device, since the hole injection layer and the hole transport layer are formed first, and then the quantum dot light-emitting layer and the first electron transport layer are formed on a surface, a solvent of the quantum dot light-emitting layer may damage a front film layer and lead to a large number of interface defects, resulting in a decrease in the efficiency of quantum dot light-emitting device. Therefore, in the upright device, it is difficult to deposit various small molecular materials for the hole transport layer and the hole injection layer by evaporation, and the effect may be poor. For the above reason, the selectable scope of materials for the inverted structure is wider.

Figure 6:
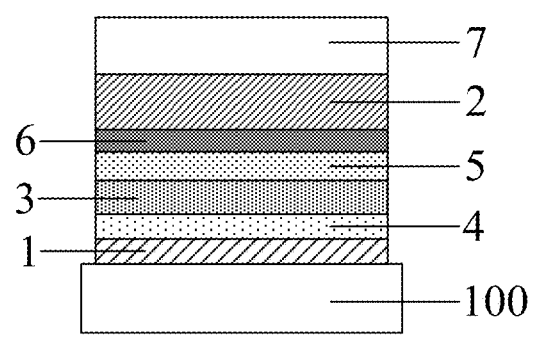
FIG. 6 is a schematic structural diagram of another green quantum dot light-emitting device with an inverted structure provided by an embodiment of the present disclosure.

Therefore, during specific implementation, in the above green quantum dot light-emitting device provided by the embodiment of the present disclosure, as shown in FIG. 6, the green quantum dot light-emitting device provided by the embodiment of the present disclosure is preferably of the top emission structure. More preferably, the green quantum dot light-emitting device provided by the embodiment of the present disclosure is preferably of the inverted structure, and the green quantum dot light-emitting device further includes a substrate 100 on one side of the first cathode 1 away from the light-emitting layer 3. The substrate 100 may be a glass substrate, or a flexible substrate, such as polyethylene terephthalate (PET), etc., or may be other materials known in the art that may be used as the substrate of the green quantum dot light-emitting device. It may be understood by those skilled in the art that the green quantum dot light-emitting device may also be an upright bottom emission structure, an upright top emission structure or an inverted bottom emission structure.

It should be noted that the thickness of the first electron transport layer 4 in the embodiment of the present disclosure is preferably in a range of 10 nm to 40 nm. In actual manufacturing, when selecting a certain thickness within this range, there may be an error of ±2 nm. For example, when the thickness of the first electron transport layer 4 is designed to be 30 nm. Due to a process error, the thickness of the first electron transport layer 4 obtained by actually manufacturing may be 28 nm or 32 nm. The thickness of the first hole transport layer 5 is preferably in a range of 26 nm to 39 nm. When a certain thickness within this range is selected, there may be an error of ±2 nm. For example, when the thickness of the first hole transport layer 5 is designed to be 30 nm. Due to the process errors, the thickness of the first hole transport layer 5 obtained by actually manufacturing may be 28 nm or 32 nm.

During specific implementation, in the above green quantum dot light-emitting device provided by the embodiment of the present disclosure, as shown in FIG. 3 and FIG. 6, the thickness of the first electron transport layer 4 is more preferably, for example, in a range of 12 nm to 39 nm, 14 nm to 38 nm, 16 nm to 37 nm, 18 nm to 36 nm, 20 nm to 35 nm, 22 nm to 35 nm, 25 nm to 35 nm, 28 nm to 32 nm, or 29 nm to 31 nm, or more preferably 30 nm; and the thickness of the first hole transport layer 5 is more preferably, for example, in a range of 26 nm to 38 nm, 27 nm to 37 nm, 28 nm to 36 nm, 29 nm to 35 nm, 29 nm to 34 nm, 29 nm to 33 nm, 29 nm to 32 nm, or 29 nm to 31 nm, or more preferably 30 nm. In this way, the optimal light emitting angle of the green quantum dot light-emitting device provided by the embodiment of the present disclosure is top light emitting (in the normal direction), and the light emitting intensity is strong.

During specific implementation, in the above green quantum dot light-emitting device provided by the embodiment of the present disclosure, as shown in FIG. 3 and FIG. 6, the thickness of the green quantum dot light-emitting layer 3 is preferably in a range of 10 nm to 40 nm, or further preferably 15 nm to 35 nm, or more preferably 20 nm to 30 nm. The thickness of the green quantum dot light-emitting layer 3 used in a simulation experiment performed in the embodiment of the present disclosure is in a range of 20 nm to 30 nm, and the green quantum dot light-emitting device with light emitting intensity concentrated on the front side of the screen may be obtained.

During specific implementation, in the above green quantum dot light-emitting device provided by the embodiment of the present disclosure, as shown in FIG. 3 and FIG. 6, a material of the green quantum dot light-emitting layer 3 includes but is not limited to one of CdS, CdSe, ZnSe, InP, PbS, $CsPbCl_3$, $CsPbBr_3$, $CsPbI_3$, CdS/ZnS, CdSe/ZnSe, CdSe/ZnS, ZnSe, InP/ZnS, PbS/ZnS, $CsPbCl_3$/ZnS, $CsPbBr_3$/ZnS or $CsPhI_3$/ZnS and other quantum dot materials, more preferably CdSe or InP. In the present disclosure, holes and electrons are injected from the first anode and the first cathode respectively, and reach the quantum dot light-emitting layer after charge transport. A conduction band and a valence band of the quantum dots capture the electrons and the holes respectively, and are recombined to emit light.

A light-emitting wavelength of the green quantum dot material is in a range of 510 nm to 550 nm, and the commonly-used green light wavelength is in a range of 520 nm to 535 nm.

During specific implementation, in the above green quantum dot light-emitting device provided by the embodiment of the present disclosure, as shown in FIG. 3 and FIG. 6, the material of the first electron transport layer 4 is preferably $Zn_{1-x}Mg_xO$, where x is in a range of 0 to 0.2, and $Zn_{1-x}Mg_xO$ means that a molar ratio of Zn to Mg is (1-x):x. The green quantum dot light-emitting device of the present disclosure uses $Zn_{1-x}Mg_xO$ as the material of the first electron transport layer 4, wherein a value of x may be arbitrarily regulated in the range of 0 to 1 to obtain first electron transport layers 5 with different band gap widths and energy level positions, and the ratio of Zn to Mg may be freely regulated according to electron injection barriers required by the different light-emitting layers 3, so that the first electron transport layer 4 and the light-emitting layer 3 are matched with each other, thereby improving the light-emitting efficiency of the green quantum dot light-emitting device.

Figure 7:
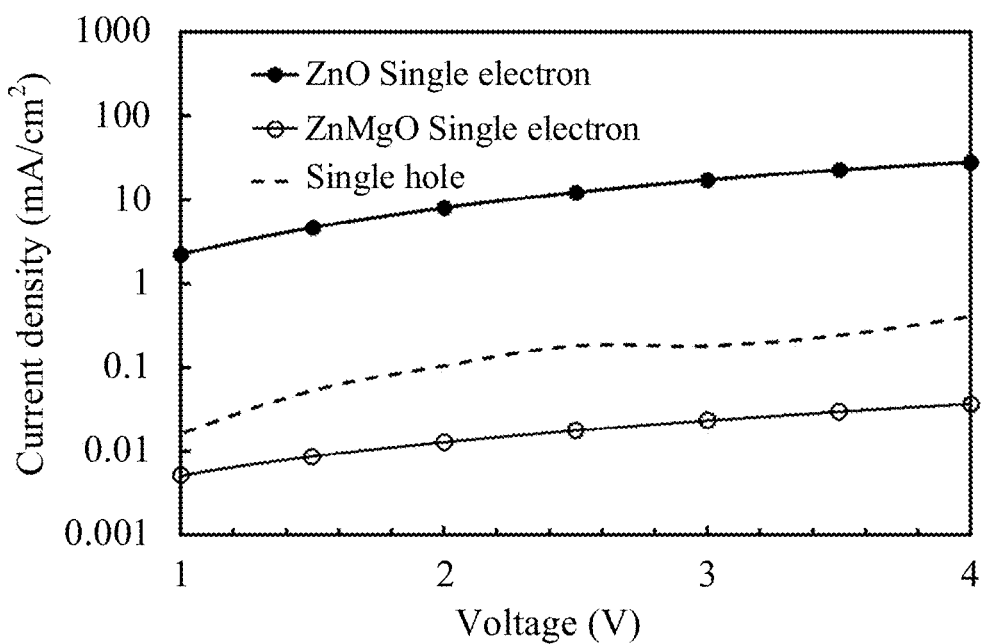
FIG. 7 is a schematic diagram showing comparison of electron injection performance and hole injection performance of a green quantum dot material when a material of the first electron transport layer is ZnO and $Zn_{0.85}Mg_{0.15}O$ according to an embodiment of the present disclosure.

When x=0, the material of the first electron transport layer 4 is ZnO. When x>0, for example, x=0.15, the material of the first electron transport layer 4 is $Zn_{0.85}Mg_{0.15}O$. The embodiment of the present disclosure compares electron injection performance and hole injection performance of the green quantum dot material when the material of the first electron transport layer 4 is ZnO and $Zn_{0.85}Mg_{0.15}O$. As shown in FIG. 7, a dotted line represents a current density of hole injection. In FIG. 7, $Zn_{0.85}Mg_{0.15}O$ is represented by ZnMgO. It may be seen that when ZnO is adopted as the first electron transport layer, its electron injection is much more than hole injection; while when ZnMgO is adopted as the first electron transport layer, its electron injection is less than hole injection, but electron injection and hole injection are approximate in value.

Figure 8A:
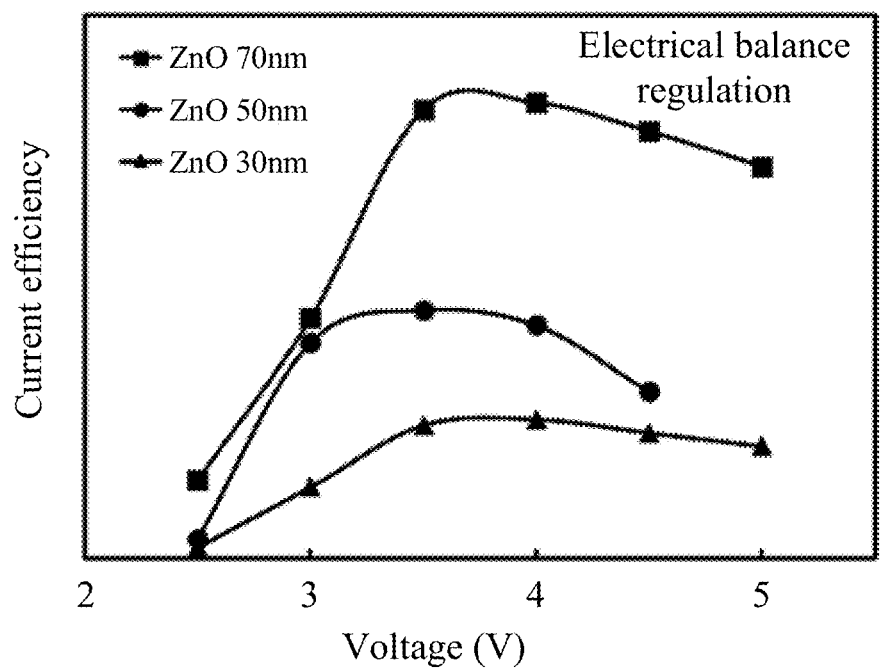
FIG. 8A is a schematic diagram of a current efficiency of a bottom-emitting green quantum dot light-emitting device using ZnO as a first electron transport layer material.
Figure 8B:
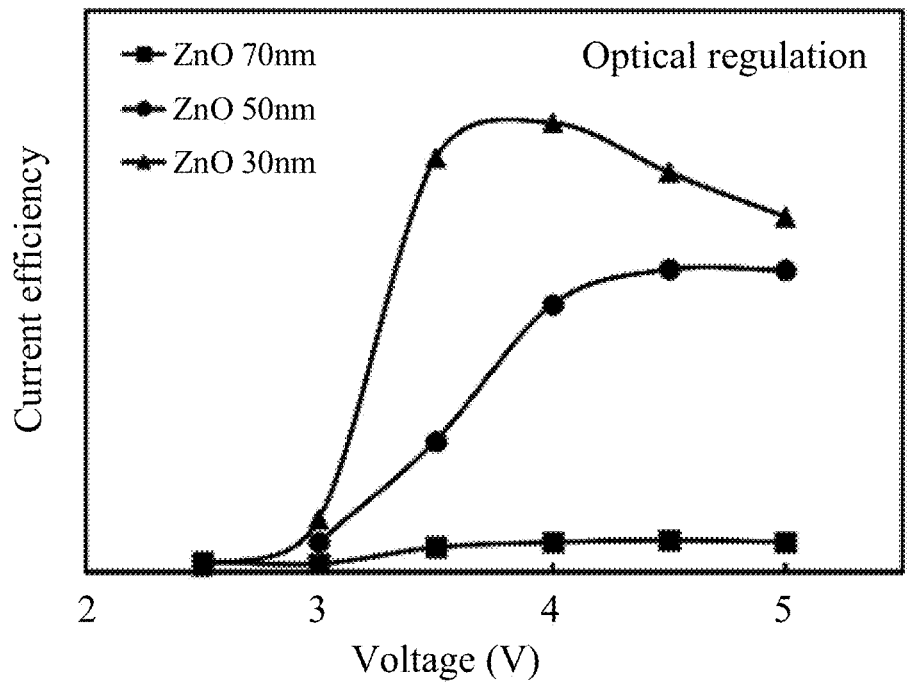
FIG. 8B is a schematic diagram of a current efficiency of a top-emitting green quantum dot light-emitting device using ZnO as a first electron transport layer material.

As shown in FIG. 8A, FIG. 8A is a schematic diagram of a current efficiency test result of the inverted bottom-emitting green quantum dot light-emitting device adopting ZnO as the first electron transport layer. In the inverted bottom-emitting green quantum dot light-emitting device, a material of the first cathode is ITO (for example, 10 nm thickness), a material of the first anode is opaque Ag (for example, 80 nm thickness), a thickness of the first hole transport layer is 30 nm, a refractive index of the first hole transport layer is in a range of 1.9 to 2.1, a refractive index of the first electron transport layer is in a range of 1.25 to 1.51, a thickness of the green quantum dot light-emitting layer is in a range of 20 nm to 30 nm, a refractive index of the green quantum dot light-emitting layer is in a range of 1.78 to 1.94, a thickness of the first hole injection layer is 5 nm, a refractive index of the first hole injection layer is in a range of 1.8 to 2, and current efficiencies of the bottom-emitting green quantum dot light-emitting devices with the first electron transport layers of different thicknesses (30 nm, 50 nm, 70 nm) are tested. The greater the current efficiency is, the more balanced the carrier injection is. It may be seen that if the optimal current efficiency is to be achieved, that is, if the electron/hole injection reaches or is close to a balance state, the thickness of the required first electron transport layer needs to be thicker (e.g., is 70 nm). As shown in FIG. 8B, FIG. 8B is a schematic diagram of a current efficiency test result of the inverted top-emitting green quantum dot light-emitting device adopting ZnO as the first electron transport layer. In the inverted top-emitting green quantum dot light-emitting device, a material of the first cathode is ITO (for example, 10 nm thickness), an opaque refractive layer (for example, 100 nm thickness) is increased on the outer side of the first cathode, a material of the first anode is thin semi-transparent Ag (for example, 15 nm thickness), a thickness of the first hole transport layer is 30 nm, a refractive index of the first hole transport layer is in a range of 1.9 to 2.1, a refractive index of the first electron transport layer is in a range of 1.25 to 1.51, a thickness of the green quantum dot light-emitting layer is in a range of 20 nm to 30 nm, a refractive index of the green quantum dot light-emitting layer is in a range of 1.78 to 1.94, a thickness of the first hole injection layer is 5 nm, a refractive index of the first hole injection layer is in a range of 1.8 to 2, and current efficiencies of the top to emitting green quantum dot light-emitting devices with the first electron transport layers of different thicknesses (30 nm, 50 nm, 70 nm) are tested. It may be seen that when the thickness of the first electron transport layer is 30 nm, the device reaches the maximum current efficiency. That is, in bottom emission, the optimal thickness of ZnO is 70 nm; and in top emission, the optimal thickness of ZnO is 30 nm. Therefore, when ZnO is adopted as the material of the first electron transport layer, the thickness of the first electron transport layer corresponding to the optimal current efficiency corresponding to the bottom emission structure and the thickness of the first electron transport layer corresponding to the optimal current efficiency corresponding to the top emission structure are not within the same range. This shows that when the inverted top-emitting device reaches the maximum current efficiency, its electron/hole injection balance is not optimized.

Figure 9A:
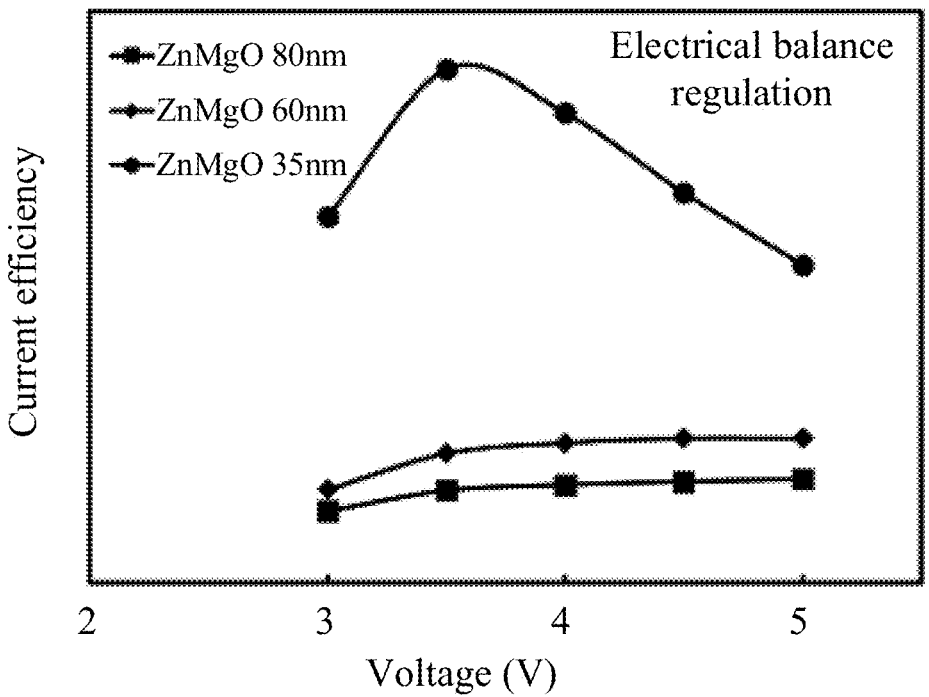
FIG. 9A is a schematic diagram of a current efficiency of a bottom-emitting green quantum dot light-emitting device using $Zn_{0.85}Mg_{0.15O}$ as a first electron transport layer material.
Figure 9B:
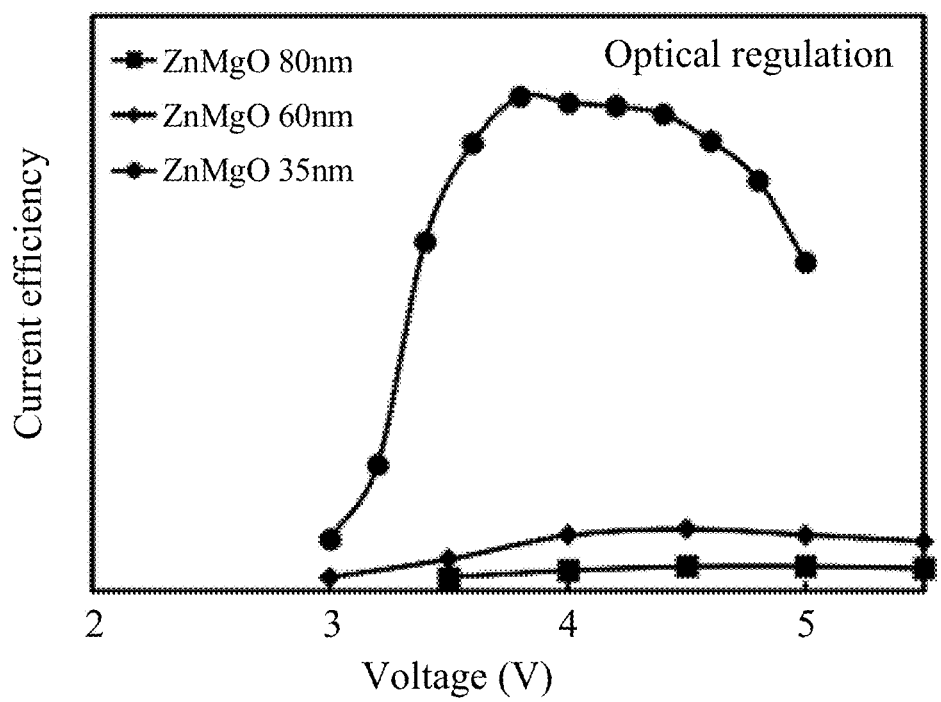
FIG. 9B is a schematic diagram of a current efficiency of a top-emitting green quantum dot light-emitting device using $Zn_{0.85}Mg_{0.15O}$ as a first electron transport layer material.

In some embodiments of the present disclosure, $Zn_{0.85}Mg_{0.15}O$ is adopted as the first electron transport layer. As shown in FIG. 9A and FIG. 9B, FIG. 9A is a schematic diagram of the current efficiency of the bottom-emitting green quantum dot light-emitting device adopting $Zn_{0.85}Mg_{0.15}O$ as the first electron transport layer, FIG. 9B is a schematic diagram of the current efficiency of the top-emitting green quantum dot light-emitting device adopting $Zn_{0.85}Mg_{0.15}O$ as the first electron transport layer. FIG. 9A and FIG. 9B illustrate $Zn_{0.85}Mg_{0.15}O$ by ZnMgO. That is, ZnO is doped with Mg, and when the doping concentration of Mg increases, mobility of the first electron transport layer decreases. In order to keep the quantity of electrons reaching the light-emitting layer per unit time unchanged, the thickness of the first electron transport layer may be required to be thin. It may be seen from FIG. 9A and FIG. 9B that in order to achieve the optimal current efficiency, that is, the electron/hole injection reaches or is near the balanced state, the thickness of the first electron transport layer is required to be thin, and the optimal thickness of $Zn_{0.85}Mg_{0.15}O$ corresponding to the bottom emission structure is 35 nm. When the top emission structure reaches the maximum current efficiency, the optimal thickness of $Zn_{0.85}Mg_{0.15}O$ corresponding to the top emission structure is still 35 nm, so the optimal thickness of the first electron transport layer corresponding to the bottom emission structure is the same as the optimal thickness of the first electron transport layer corresponding to the top emission structure. When $Zn_{0.85}Mg_{0.15}O$ is adopted as the material of the first electron transport layer, the green quantum dot light-emitting device with better performance may be obtained.

To sum up, in the embodiment of the present disclosure, preferably x=0.15, that is, the material of the first electron transport layer 4 is more preferably $Zn_{0.85}Mg_{0.15}O$. In the present disclosure, $Zn_{0.85}Mg_{0.15}O$ has higher electron mobility, and $Zn_{0.85}Mg_{0.15}O$ is adopted as the material of the first electron transport layer 4, which is more conducive to efficient injection of electrons from the first cathode 1 into the light-emitting layer 3, moreover, may prevent leakage of holes to adjacent layers, and improve a charge recombination efficiency.

It should be noted that the material $Zn_{1-x}Mg_xO$ of the first electron transport layer 4 provided in the embodiment of the present disclosure is described by taking an example of doping with Mg, and of course other metal materials may also be doped, as long as the first electron transport layer 4 and the light-emitting layer 3 are matched with each other by regulating a proportion of Zn and the doped metal material, thereby improving the light-emitting efficiency of the green quantum dot light-emitting device.

During specific implementation, in the above green quantum dot light-emitting device provided by the embodiment of the present disclosure, as shown in FIG. 6, the material of the first hole transport layer 5 may be an organic material or an inorganic material. When the material of the first hole transport layer 5 is the organic material, the organic material includes but is not limited to polyvinylcarbazole (PVK), or poly(9,9-dioctylfluorene-alt-N-(4-sec-butylphenyl)-diphenylamine) (TFB), or N,N'-diphenyl-N,N'-bis(3-methylbenzene)-(1,1'-biphenyl)-4,4'-diamine (TPD), or 4,4',4''-tris(carbazol-9-yl)triphenylamine (TCTA) or N,N'-diphenyl-N,N'-bis(1-naphthyl)-1,1'-biphenyl-4-4'-diamine (NPB). When the material of the first hole transport layer 5 is the inorganic material, the inorganic material includes but is not limited to NiOx or VOx.

Figure 10:
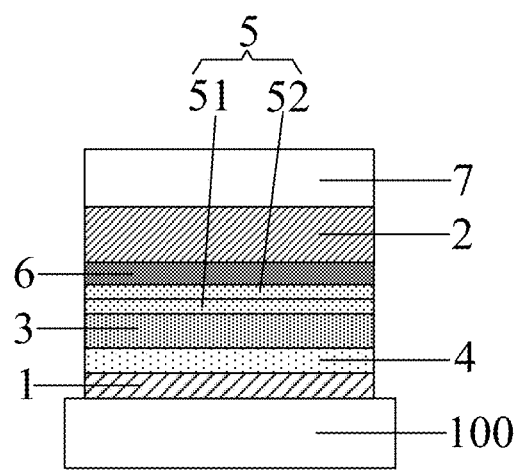
FIG. 10 is a schematic structural diagram of another green quantum dot light-emitting device with an inverted structure provided by an embodiment of the present disclosure.

During specific implementation, in the above green quantum dot light-emitting device provided by the embodiment of the present disclosure, as shown in FIG. 10, the first hole transport layer 5 includes a first sub hole transport layer 51 and a second sub hole transport layer 52 laminated with each other, the first sub hole transport layer 51 is close to the light-emitting layer 3, the second sub hole transport layer 52 is away from the light-emitting layer 3, and an HOMO energy level of the first sub hole transport layer 51 is smaller than an HOMO energy level of the second sub hole transport layer 52. In this way, compared with the second sub hole transport layer 52, the HOMO energy level of the first sub hole transport layer 51 and the HOMO energy level of an interface of the light-emitting layer 3 are approximate in value, which is conducive to the injection of holes from the first hole transport layer 5 into the light-emitting layer 3, may effectively balance the carriers in the light-emitting layer 3, and improves the light-emitting efficiency and lifetime of the green quantum dot light-emitting device.

During specific implementation, in the above green quantum dot light-emitting device provided by the embodiment of the present disclosure, as shown in FIG. 10, the HOMO energy level of the first sub hole transport layer 51 is preferably in a range of −5.5 eV to −6.2 eV, and the energy level is close to the energy level of the light-emitting layer 3 in value, which is beneficial to hole injection. The HOMO energy level of the second sub hole transport layer 52 is preferably in a range of −5.3 eV to −5.0 eV. The material of the first sub hole transport layer 51 may include 4,4',4"-tris (carbazol-9-yl)triphenylamine, TCTA for short, and an HOMO energy level of TCTA is −5.7 eV. The material of the second sub hole transport layer 52 may include N,N'-diphenyl-N, N'-bis(1-naphthyl)-1,1'-biphenyl-4-4'-diamine, NPB for short, and an HOMO level of NPB is −5.4 eV.

It should be noted that an orbit with the highest energy level of the occupied electron is called the highest occupied molecular orbit, which is represented by HOMO.

During specific implementation, in the above green quantum dot light-emitting device provided by the embodiment of the present disclosure, as shown in FIG. 10, a thickness of the first sub hole transport layer 51 is preferably in a range of 4 nm to 15 nm, more preferably in a range of 4 nm to 10 nm, or further preferably 5 nm. The first sub hole transport layer 51 plays the role of reducing potential energy barrier between the light-emitting layer and the second sub hole transport layer 52. That is, the first sub hole transport layer 51 is equivalent to a transition layer. So the holes of the second sub hole transport layer 52 are more easily transported to the light-emitting layer. If the thickness of the first sub hole transport layer 51 is too thin (for example, less than 4 nm), the film layer is discontinuous. If the thickness of the first sub hole transport layer 51 is too thick (for example, greater than 15 nm), hole transport is hindered. The thickness of the second sub hole transport layer 52 is preferably in a range of 20 nm to 35 nm, more preferably in a range of 20 nm to 30 nm, or further preferably 25 nm. The second sub hole transport layer 52 is mainly the material of the first hole transport layer, and is provided with high mobility, so the thickness is thicker.

During specific implementation, it is difficult for the holes to be injected into the first hole transport layer from the first anode (for example, Ag). In order to make it easier to inject the holes, the above green quantum dot light-emitting device provided by the embodiment of the present disclosure, as shown in FIG. 3, FIG. 6 and FIG. 10, further includes a first hole injection layer 6 between the first hole transport layer 5 and the first anode 2, and a thickness of the first hole injection layer 6 is preferably in a range of 1 nm to 10 nm, more preferably, for example, in a range of 3 nm to 8 nm or 4 nm to 6 nm, or further preferably 5 nm. The first hole injection layer 6 may make injection of the holes easier. In the present disclosure, the first hole transport layer 5 transfers the holes from the first anode 2, but the energy level of the commonly used hole transport material does not match with the energy level of the first anode material, so the first hole injection layer 6 is introduced. If the thickness of the first hole injection layer 6 is less than 1 nm, the film layer is discontinuous. If it is greater than 10 nm, the film layer is too thick and blocks hole transport. Therefore, by reasonably designing the thickness of the first hole injection layer 6, the holes are injected into the first hole transport layer from the first anode, which is beneficial to the transport of the holes.

During specific implementation, a material of the first hole injection layer 6 includes but is not limited to any one of PEDOT:PSS, MoOx, NiOx, CuOx, and HAT-CN. The full English name of HAT-CN is 2,3,6,7,10,11-Hexaazatriphenylenehexacabonitrile.

Figure 11:
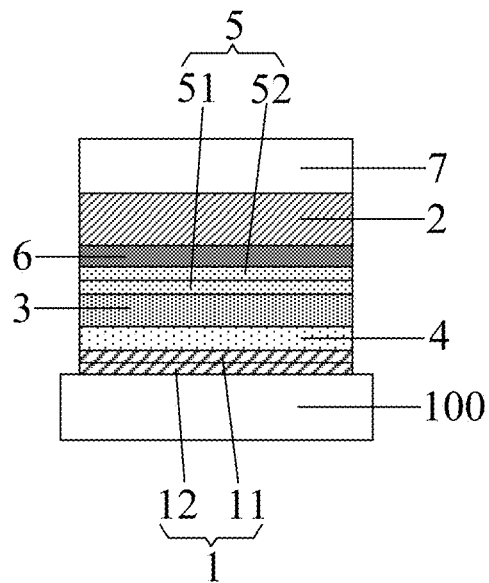
FIG. 11 is a schematic structural diagram of another green quantum dot light-emitting device with an inverted structure provided by an embodiment of the present disclosure.

During specific implementation, in the above green quantum dot light-emitting device provided by the embodiment of the present disclosure, as shown in FIG. 11, the first cathode 1 may include a metal layer 11 and a transparent conductive layer 12 laminated with each other, and the transparent conductive layer 12 is better in contact with the film layer manufactured subsequently. A material of the metal layer 11 preferably includes Al, or Ag, or Ti or Mo, more preferably Ag; and a thickness of the metal layer 11 is preferably in a range of 60 nm to 150 nm, or more preferably, for example, in a range of 70 nm to 130 nm, 80 nm to 120 nm, or 90 nm to 110 nm. The thickness of the metal layer 11 adopted in the embodiment of the present disclosure is 80 nm, which may sufficiently reflect light. A material of the transparent conductive layer 12 is preferably indium tin oxide (ITO), or fluorine-doped $SnO_2$ (FTO) or a conductive polymer, or more preferably ITO. A thickness of the transparent conductive layer 12 is preferably in a range of 5 nm to 50 nm, or more preferably, for example, in a range of 6 nm to 40 nm, 7 nm to 30 nm, 8 nm to 20 nm, or 8 nm to 10 nm. In a case that the uniform film formation is ensured, the thinner the transparent conductive layer 12 is, the better. It is ensured that the transparent conductive layer 12 completely covers the metal layer 11. The thickness of the transparent conductive layer 12 adopted in the embodiment of the present disclosure is 10 nm. Of course, the material of the first cathode 1 may further be other materials known in the art that may serve as the first cathode.

During specific implementation, in the above green quantum dot light-emitting device provided by the embodiment of the present disclosure, as shown in FIG. 3, FIG. 6, FIG. 10 and FIG. 11, the material of the first anode 2 may include Al, or Ag or Mg/Ag alloy, the thickness of the first anode 2 is preferably in a range of 10 nm to 20 nm, or more preferably, for example, in a range of 11 nm to 18 nm and 12 nm to 15 nm. If the thickness of the first anode 2 is too thin (for example, less than 10 nm), the film layer is discontinuous and conductivity is poor. If the thickness of the first anode 2 is too thick (for example, greater than 20 nm), transmittance is poor.

Or the material of the first anode 2 may also include indium tin oxide (ITO), or indium zinc oxide (IZO), or zinc gallium oxide (GZO) or indium gallium zinc oxide (IGZO). The thickness of the first anode 2 is preferably, for example, in a range of 40 nm to 200 nm, 50 nm to 150 nm, 60 nm to 120 nm, 70 nm to 100 nm, or 80 nm to 90 nm, or more preferably 80 nm. Since the material of the first anode 2 is a transparent material, the transmittance is not influenced, thus the thickness is correspondingly thicker, so that the conductivity is good.

In the embodiment of the present disclosure, the material of the first anode 2 preferably includes Al, Ag or Mg/Ag alloy, this is because when the material of the first anode 2 includes indium tin oxide (ITO), or indium zinc oxide (IZO), or zinc oxide gallium (GZO) or indium gallium zinc oxide (IGZO), a sputtering process is required, and a sputtering process temperature is high, which may damage a front film layer of the first anode 2. When the material of the first anode 2 is Al, or Ag or Mg/Ag alloy, the vapor deposition process may be used, which does not require high temperature and will not damage the front film layer of the first anode 2.

Figure 12:
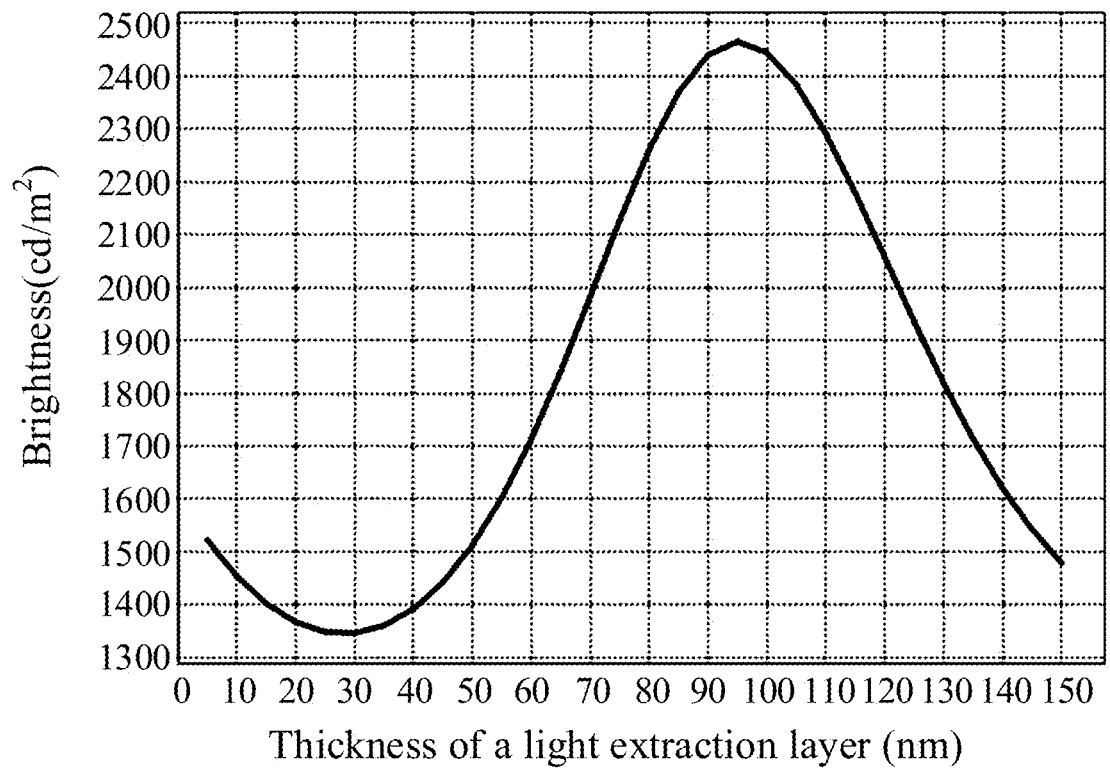
FIG. 12 is a schematic diagram for simulating influence of a thickness of a light extraction layer on a light-emitting brightness of the green quantum dot light-emitting device according to an embodiment of the present disclosure.

During specific implementation, in order to further improve the light emitting efficiency of the green quantum dot light-emitting device, the above green quantum dot light-emitting device provided by the embodiment of the present disclosure, as shown in FIG. 6, FIG. 10 and FIG. 11, further includes a light extraction layer 7 (capping layer) on one side of the first anode away from the light-emitting layer. A material of the light extraction layer 7 is an organic material with a large refractive index (for example, the refractive index is in a range of 1.4 to 2.0) and a small light absorption coefficient, which is conducive to improving the light-emitting efficiency of the green quantum dot light-emitting device. The embodiment of the present disclosure simulates the influence of the thickness of the light extraction layer 7 on the light-emitting brightness of the device. As shown in FIG. 12, it may be seen that when the thickness of the light extraction layer 7 is preferably in a range of 60 nm to 130 nm, the light-emitting efficiency of the device is good. Therefore, the thickness of the light extraction layer 7 provided by the embodiment of the present disclosure is preferably in a range of 60 nm to 130 nm, or more preferably, for example, in a range of 70 nm to 120 nm, 80 nm to 100 nm, or 90 nm to 100 nm. The thickness of the light extraction layer 7 adopted in the embodiment of the present disclosure is 80 nm.

The substrate provided by the embodiment of the present disclosure includes a base substrate, a driving circuit between the base substrate and the first cathode, and structures such as a passivation layer and a flattening layer between the driving circuit and the first cathode.

Figure 13:
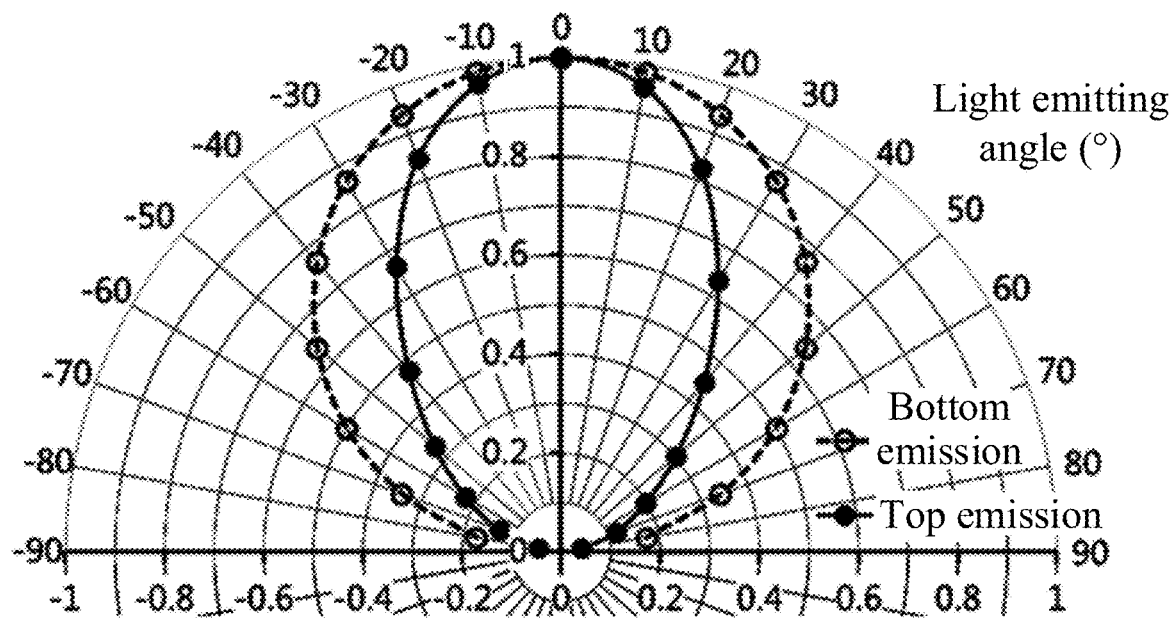
FIG. 13 is a schematic diagram comparison diagram of light emitting angle distribution of an inverted bottom-emitting green quantum dot light-emitting device in the prior art and an optimized inverted top-emitting green quantum dot light-emitting device provided by an embodiment of the present disclosure.

As shown in FIG. 13, FIG. 13 is schematic diagram of the comparison between light emitting angle distribution of an inverted bottom-emitting green quantum dot light-emitting device in the prior art and the optimized inverted top-emitting green quantum dot light-emitting device provided by the embodiment of the present disclosure. It may be seen that after the thickness of each film layer in the green quantum dot light-emitting device is optimized and the $Zn_{0.85}Mg_{0.15}O$ is selected as the material of the first electron transport layer, that is, after the light emitting is optimized, the optimal light emitting angle of the top-emitting device provided by the embodiment of the present disclosure is top light emitting, that is, the light emitting angle is narrower, especially suitable for a small-sized screen such as a mobile phone.

Figure 14:
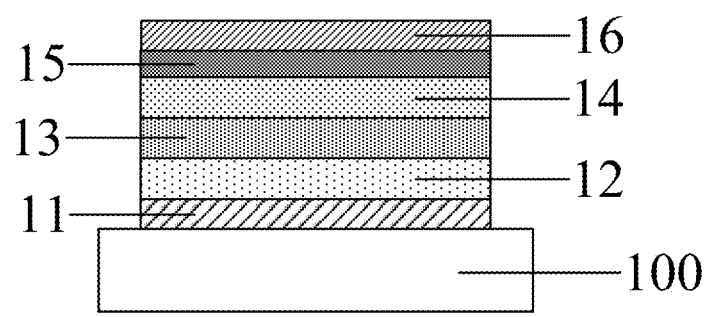
FIG. 14 is a schematic structural diagram of a red quantum dot light-emitting device with an inverted structure provided by an embodiment of the present disclosure.

An embodiment of the present disclosure further provides a red quantum dot light-emitting device. The red quantum dot light-emitting device includes an upright structure and an inverted structure, and a light emitting mode of the red quantum dot light-emitting device includes top emission and bottom emission. Preferably, for the same reason as the green quantum dot light-emitting device, the red quantum dot light-emitting device is of an inverted top emission structure. As shown in FIG. 14, FIG. 14 takes an example that the red quantum dot light-emitting device is of an inverted top emission structure. The red quantum dot light-emitting device includes: a second cathode 11 and a second anode 16 opposite to each other, a red quantum dot light-emitting layer 13 between the second cathode 11 and the second anode 16, a second electron transport layer 12 between the second cathode 11 and the red quantum dot light-emitting layer 13, a second hole transport layer 14 between the red quantum dot light-emitting layer 13 and the second anode 16, and a second hole injection layer 15 between the second anode 16 and the second hole transport layer 14.

The second cathode 11 includes a reflective film layer, the second anode 16 includes a transflective film layer, and the device emits light from one side of the second anode 16. The reflective film layer is an opaque film layer and may reflect light.

A material of the second electron transport layer 12 includes an oxide containing Zn, and the material of the second electron transport layer 12 is the same as the material of the aforementioned first electron transport layer 4.

Figure 15:
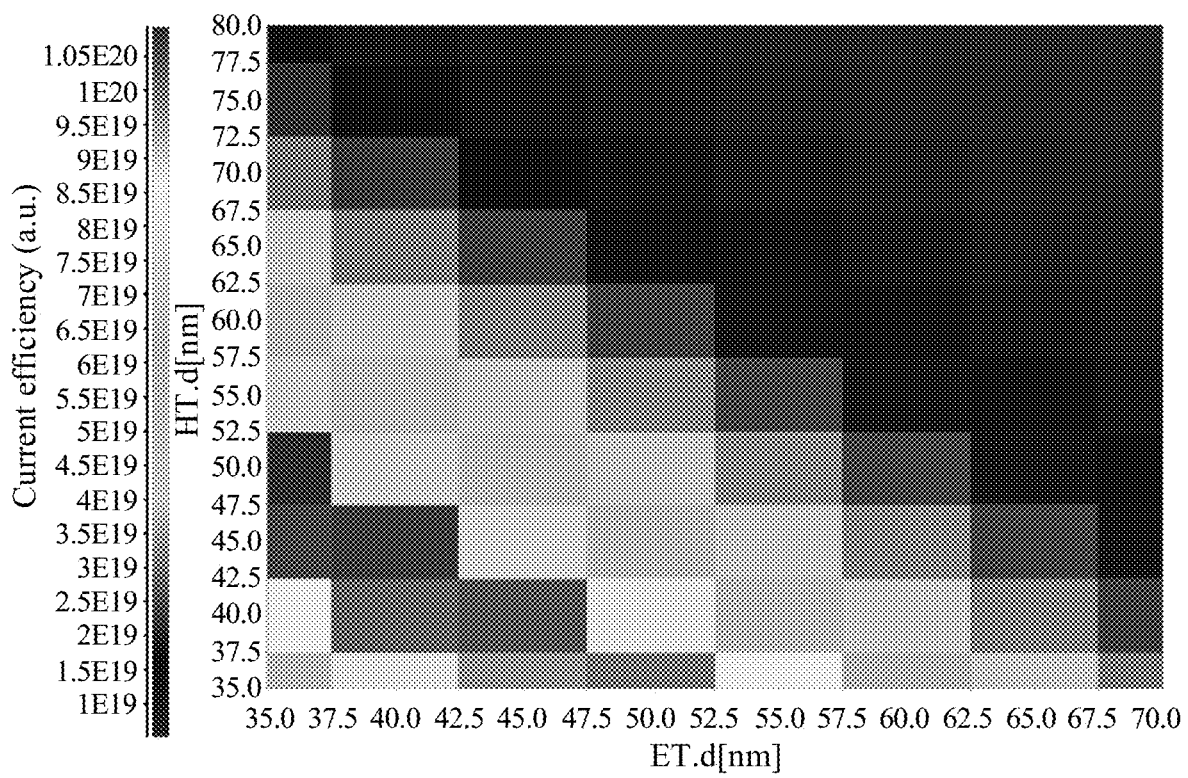
FIG. 15 is a schematic diagram for simulating light emitting intensity corresponding to electron transport layers and hole transport layers with different thicknesses of a red quantum dot light-emitting device in FIG. 14.

For a structure shown in FIG. 14, an inventor of this disclosure simulated the light-emitting intensity of the red quantum dot device in the normal direction for the second electron transport layer 12 and the second hole transport layer 14 with different thicknesses. As shown in FIG. 15, an abscissa is the thickness of the second electron transport layer 12 (represented by ET.d), an ordinate is the thickness of the second hole transport layer 14 (represented by HT.d), and the bar type on the left side is the light-emitting intensity. When a thickness of ET is in a range of 35.0 nm to 60.0 nm and a thickness of HT is in a range of 35.0 nm to 65.0 nm, a current efficiency of the red quantum dot device in the normal direction may be greater than 2E19a.u., that is, the light-emitting intensity in the normal direction is stronger. Therefore, in the red quantum dot light-emitting device provided by the embodiment of the present disclosure, the thickness of the second electron transport layer 12 is in a range of 35 nm to 60 nm, and the thickness of the second hole transport layer 14 is in a range of 35 nm to 65 nm.

During specific implementation, in order to further improve the light-emitting intensity of the red quantum dot light-emitting device in the normal direction, in the above display apparatus provided by the embodiment of the present disclosure, as shown in FIG. 15, the thickness of the second electron transport layer is preferably in a range of 37.5 nm to 42.5 nm, and the thickness of the second hole transport layer is preferably in a range of 42.5 nm to 47.5 nm.

During specific implementation, the red quantum dot light-emitting device and the aforementioned green quantum dot light-emitting device may be provided with the same structure. For example, the red quantum dot light-emitting device and the green quantum dot light-emitting device are both inverted top-emitting devices, or inverted bottom-emitting devices, or upright top-emitting devices, or upright bottom-emitting devices in the display apparatus.

During specific implementation, material components of the electron transport layer and/or the hole transport layer in the red quantum dot light-emitting device may be the same as that in the green quantum dot light-emitting device. For example, the electron transport layer in the red quantum dot light-emitting device and the electron transport layer in the green quantum dot light-emitting device include oxides formed by the same metal element, the difference between them lies in the different molar ratios of the metal elements; and the hole transport layer in the red quantum dot light-emitting device and the hole transport layer in the green quantum dot light-emitting device includes a mixture composed of the same substance, and the difference between them lies in the different mixing ratios of the substances.

Figure 16:
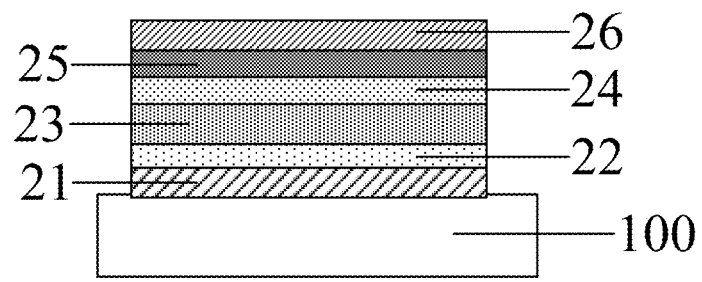
FIG. 16 is a schematic structural diagram of a blue quantum dot light-emitting device with an inverted structure provided by an embodiment of the present disclosure.

An embodiment of the present disclosure further provides a blue quantum dot light-emitting device. The blue quantum dot light-emitting device includes an upright structure and an inverted structure, and a light emitting mode of the blue quantum dot light-emitting device includes top emission and bottom emission. Preferably, for the same reason as the green quantum dot light-emitting device, the blue quantum dot light-emitting device is of an inverted top emission structure. As shown in FIG. 16, FIG. 16 takes an example that the blue quantum dot light-emitting device is of an inverted top emission structure. The blue quantum dot light-emitting device includes: a third cathode 21 and a third anode 26 opposite to each other, a blue quantum dot light-emitting layer 23 between the third cathode 21 and the third anode 26, a third electron transport layer 22 between the third cathode 21 and the blue quantum dot light-emitting layer 23, a third hole transport layer 24 between the blue quantum dot light-emitting layer 23 and the third anode 26, and a third hole injection layer 25 between the third anode 26 and the third hole transport layer 24.

The third cathode 21 includes a reflective film layer, the third anode 26 includes a transflective film layer, and the device emits light from one side of the third anode 26. The reflective film layer is an opaque film layer and may reflect light.

A material of the third electron transport layer 22 includes an oxide containing Zn. The material of the third electron transport layer 22 is the same as the material of the first electron transport layer.

Figure 17:
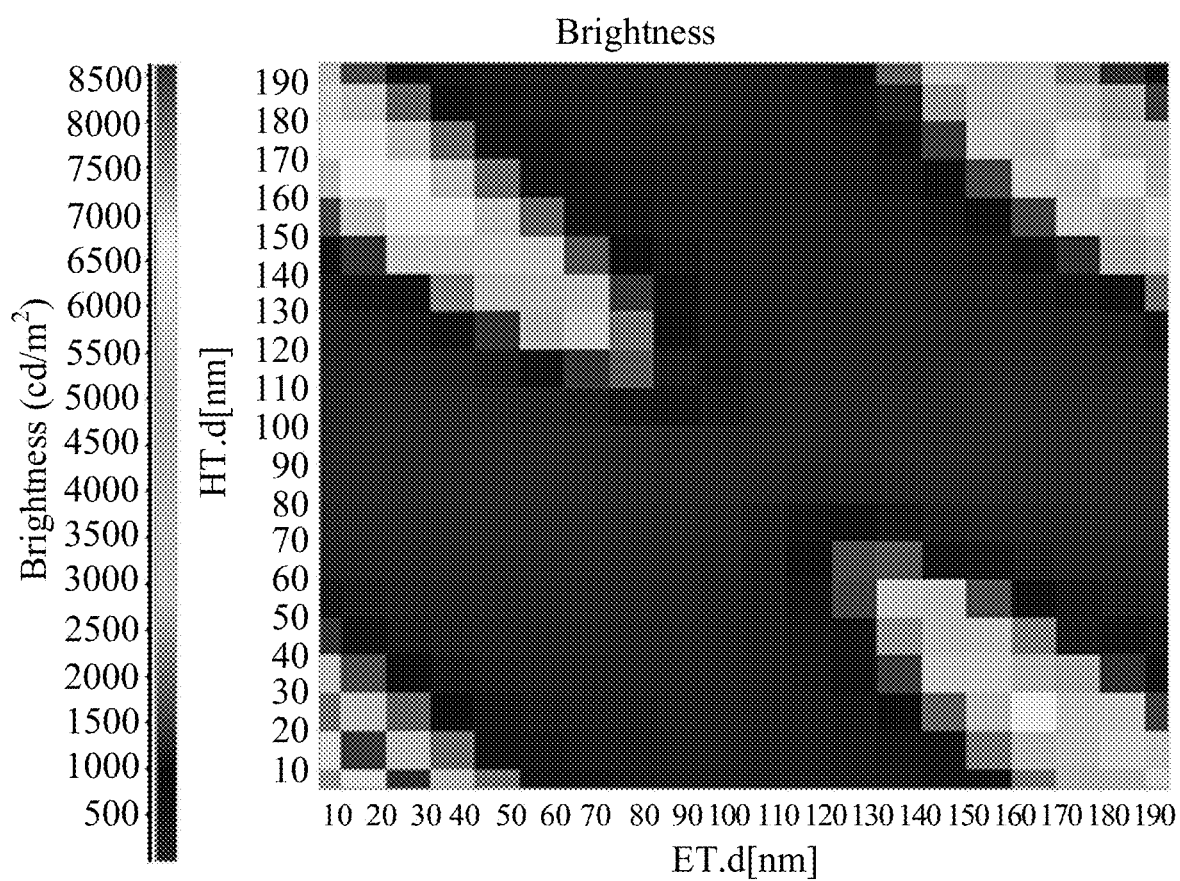
FIG. 17 is a schematic diagram for simulating light emitting intensity corresponding to electron transport layers and hole transport layers with different thicknesses of a blue quantum dot light-emitting device in FIG. 16.

For a structure shown in FIG. 16, an inventor of this disclosure simulated the light-emitting intensity of the blue quantum dot device in the normal direction for the third electron transport layer 22 and the third hole transport layer 24 with different thicknesses. As shown in FIG. 17, an abscissa is the thickness of the third electron transport layer 22 (represented by ET.d), an ordinate is the thickness of the third hole transport layer 24 (represented by HT.d), the bar type on the left side is the light-emitting intensity. When a thickness of ET is in a range of 10 nm to 30 nm and a thickness of HT is in a range of 10 nm to 30 nm, the light-emitting intensity of the blue quantum dot device in the normal direction may be greater than 2500 $cd/m^2$, that is, the light-emitting intensity in the normal direction is stronger. Therefore, in the blue quantum dot light-emitting device provided by the embodiment of the present disclosure, the thickness of the third electron transport layer 22 is in a range of 10 nm to 30 nm, and the thickness of the third hole transport layer 24 is in a range of 10 nm to 30 nm.

During specific implementation, in order to further improve the light-emitting intensity of the blue quantum dot light-emitting device in the normal direction, in the above display apparatus provided by the embodiment of the present disclosure, as shown in FIG. 17, the thickness of the third electron transport layer 22 is preferably in a range of 15 nm to 25 nm, and the thickness of the third hole transport layer 24 is preferably in a range of 10 nm to 20 nm.

The light-emitting wavelength of the blue quantum dot materials is in a range of 610 nm to 645 nm, and the commonly used blue light wavelength is in a range of 620 nm to 635 nm; and the light-emitting wavelength of the blue quantum dot materials is in a range of 440 nm to 490 nm, and the commonly used blue light wavelength is in a range of 450 nm to 470 nm.

During specific implementation, the blue quantum dot light-emitting device and the aforementioned green quantum dot light-emitting device may have the same structure. For example, the blue quantum dot light-emitting device and the green quantum dot light-emitting device are both inverted top-emitting devices, or inverted bottom-emitting devices, or upright top-emitting devices, or upright bottom-emitting devices in the display apparatus.

During specific implementation, material components of the electron transport layer and/or the hole transport layer in the blue quantum dot light-emitting device and may be the same as that in the green quantum dot light-emitting device may be the same. For example: the electron transport layer in the blue quantum dot light-emitting device and the electron transport layer in the green quantum dot light-emitting device include oxides formed by the same metal element, the difference between them lies in the different molar ratios of the metal elements; and the hole transport layer in the blue quantum dot light-emitting device and the hole transport layer in the green quantum dot light-emitting device include a mixture composed of the same substance, and the difference between them lies in the different mixing ratios of the substances.

Based on the same inventive concept, an embodiment of the present disclosure further provides a method for manufacturing the above green quantum dot light-emitting device, including the following.

A first cathode and a first anode opposite to each other are manufactured, a light-emitting layer between the first cathode and the first anode is manufactured, a first electron transport layer between the first cathode and the light-emitting layer is manufactured, and a first hole transport layer between the light-emitting layer and the first anode is manufactured.

A material of the first electron transport layer includes an oxide containing Zn, a thickness of the first electron transport layer is in a range of 10 nm to 40 nm, and a thickness of the first hole transport layer is in a range of 26 nm to 39 nm.

According to the method for manufacturing the above green quantum dot light-emitting device provided by the embodiment of the present disclosure, the material for manufacturing the first electron transport layer adopts the oxide containing Zn, the thickness of the first electron transport layer is preferably in a range of 10 nm to 40 nm, and the thickness of the first hole transport layer is preferably in a range of 26 nm to 39 nm. In the present disclosure, by optimizing the thicknesses of the first electron transport layer and the first hole transport layer, a current efficiency of the green quantum dot light-emitting device is improved, and the front-side light emitting intensity of the green quantum dot light-emitting device is improved, the light-emitting angle distribution is narrowed, and the light-emitting intensity is concentrated on the front side of a screen (normal direction).

Figure 18:
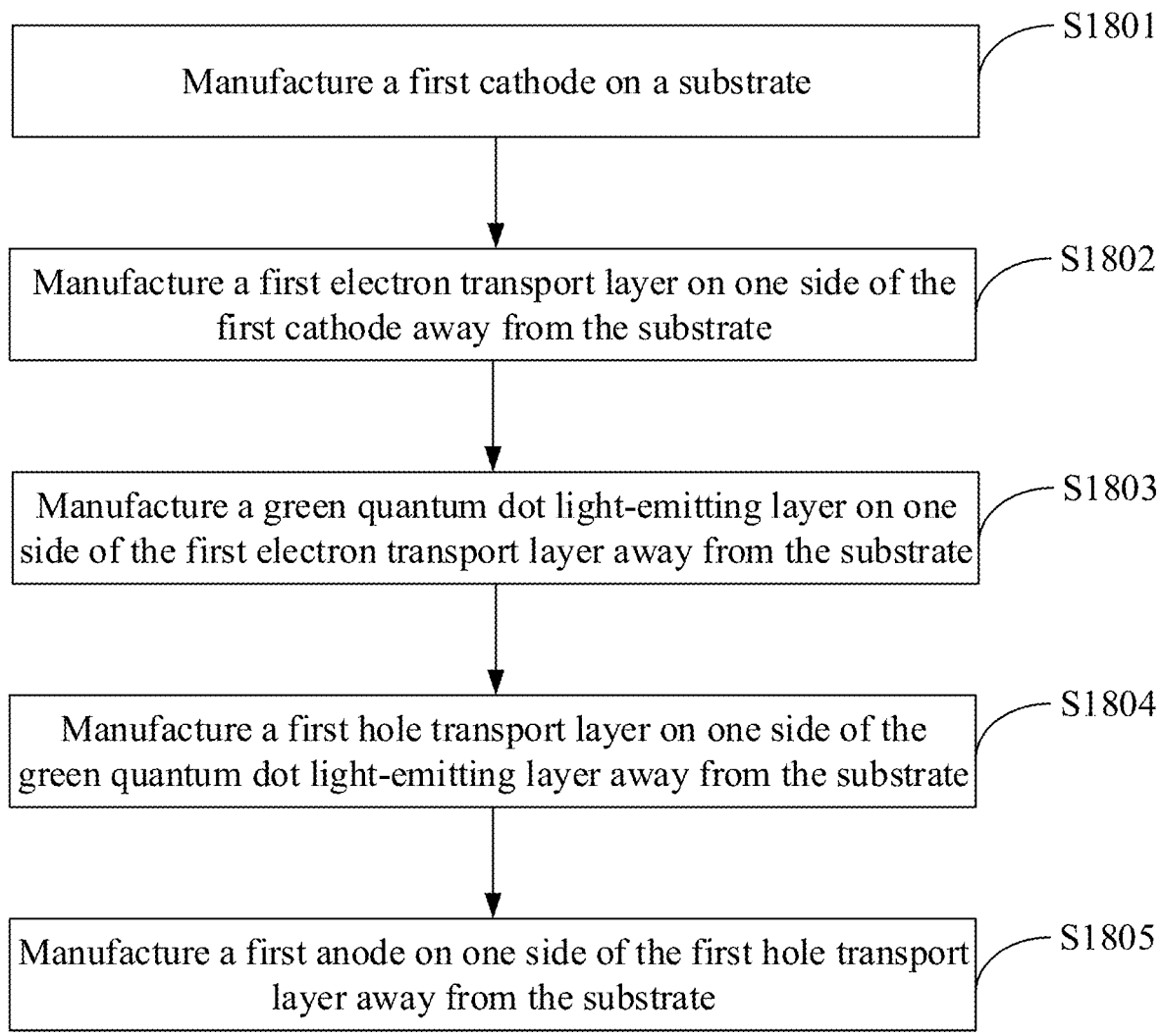
FIG. 18 is a flow diagram of a method for manufacturing a green quantum dot light-emitting device provided by an embodiment of the present disclosure.

During specific implementation, in the above method provided by the embodiment of the present disclosure, the manufacturing the first cathode and the first anode opposite to each other, manufacturing the light-emitting layer between the first cathode and the first anode, manufacturing the first electron transport layer between the first cathode and the light-emitting layer, and manufacturing the first hole transport layer between the light-emitting layer and the first anode, as shown in FIG. 18, may include the following.

S1801, the first cathode is manufactured on a substrate.

S1802, the first electron transport layer is manufactured on one side of the first cathode away from the substrate.

S1803, a light-emitting layer is manufactured on one side of the first electron transport layer away from the substrate.

S1804, the first hole transport layer is manufactured on one side of the light-emitting layer away from the substrate.

S1805, the first anode is manufactured on one side of the first hole transport layer away from the substrate.

During specific implementation, the above method provided by the embodiment of the present disclosure, may further include: a first hole injection layer is manufactured between the first hole transport layer and the first anode.

It should be noted that, the preferred thickness and material selection of each film layer in the above method for manufacturing the green quantum dot light-emitting device may refer to the relevant description in the aforementioned green quantum dot light-emitting device, which is not repeated here.

The above method for manufacturing each film layer in the electroluminescent light-emitting device includes but is not limited to one or more of a spin coating method, an evaporation method, a chemical vapor deposition method, a physical vapor deposition method, a magnetron sputtering method, an inkjet printing method, and an electrospray printing method.

Figure 19:
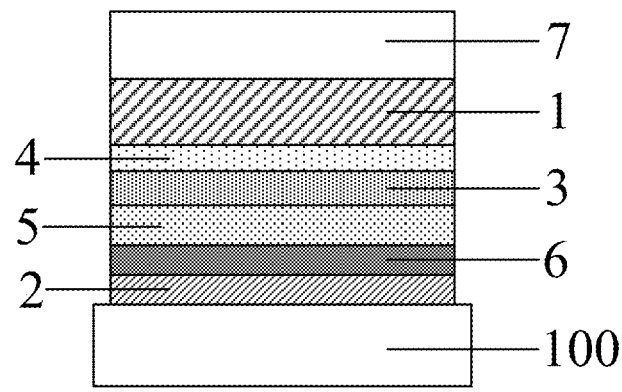
FIG. 19 is a schematic structural diagram of a green quantum dot light-emitting device with an upright structure provided by an embodiment of the present disclosure.

It should be noted that the embodiment of the present disclosure mainly takes an electroluminescent light-emitting device with an inverted structure as an example to describe the light-emitting device and the method for manufacturing the same in detail. Of course, the embodiment of the present disclosure is also applicable to the green quantum dot light-emitting device with an upright structure and the method for manufacturing the same. The structure of the green quantum dot light-emitting device with the upright structure is shown in FIG. 19, including the first anode 2, the first hole injection layer 6, the first hole transport layer 5, the light-emitting layer 3, the first electron transport layer 4 and the first cathode 1 which are sequentially stacked on the substrate 100.

The methods for manufacturing the red quantum dot light-emitting device and the blue quantum dot light-emitting device are the same as the method for manufacturing the green quantum dot light-emitting device, which is be repeated here.

Based on the same inventive concept, an embodiment of the present disclosure further provides a display apparatus, which may include a red quantum dot light-emitting device 200, a green quantum dot light-emitting device 300 and a blue quantum dot light-emitting device 400, wherein one or more of the red quantum dot light-emitting device 200, the green quantum dot light-emitting device 300 and the blue quantum dot light-emitting device 400 is the above red quantum dot light-emitting device, green quantum dot light-emitting device and blue quantum dot light-emitting device provided in the embodiment of the present disclosure.

Figure 20:
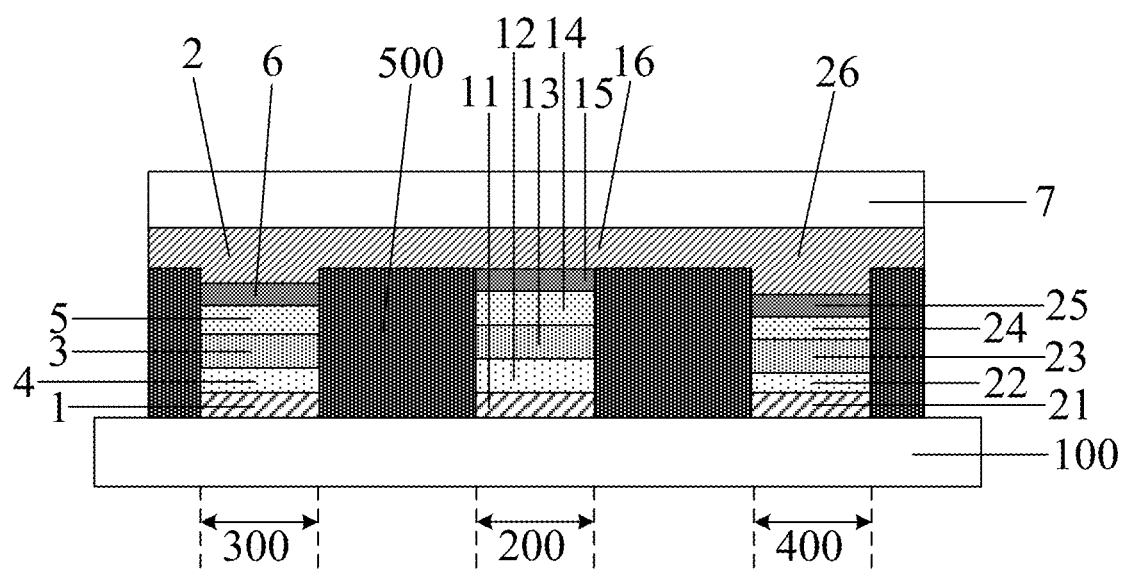
FIG. 20 is a schematic structural diagram of a display apparatus provided by an embodiment of the present disclosure.
Figure 21:
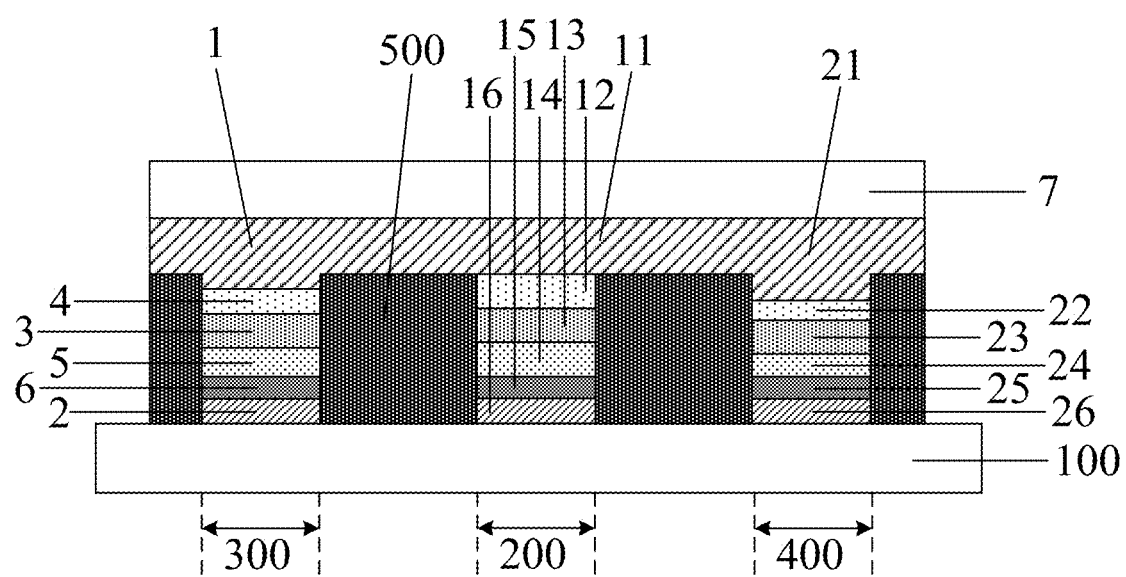
FIG. 21 is a schematic structural diagram of another display apparatus provided by an embodiment of the present disclosure.

During specific implementation, in the above display apparatus provided by the embodiment of the present disclosure, as shown in FIG. 20 and FIG. 21, the structures of the red quantum dot light-emitting device 200, the blue quantum dot light-emitting device 400 and the green quantum dot light-emitting device 300 may be the same. For example, the red quantum dot light-emitting device 200, the blue quantum dot light-emitting device 400, and the green quantum dot light-emitting device 300 are all one of inverted top emission structures, or inverted bottom emission structures, or upright top emission structures or upright bottom emission structures in the display apparatus. As shown in FIG. 20 and FIG. 21, the quantum dot light-emitting device in FIG. 20 is the inverted top emission structure, and the quantum dot light-emitting device in FIG. 21 is the upright top emission structure.

During specific implementation, material components of electron transport layers and/or hole transport layers in the red quantum dot light-emitting device 200, the blue quantum dot light-emitting device 400 and the green quantum dot light-emitting device 300 may be the same. For example: the electron transport layers include oxides formed by the same metal element, the difference among them lies in the different molar ratios of the metal elements; and the hole transport layers include a mixture composed of the same substance, and the difference among them lies in the different mixing ratios of the substances.

During specific implementation, in the above display apparatus provided by the embodiment of the present disclosure, as shown in FIG. 20, a first anode 2, a second anode 16 and a third anode 26 may be structures disposed on the whole surface; as shown in FIG. 21, a first cathode 1, a second cathode 11 and a third cathode 21 may be structures disposed on the whole surface.

During specific implementation, in the above display apparatus provided by the embodiment of the present disclosure, as shown in FIG. 20 and FIG. 21, the difference among the blue quantum dot light-emitting device 400, the red quantum dot light-emitting device 200 and the green quantum dot light-emitting device 300 is that light-emitting colors of quantum dots are different, the thickness of the electron transport layers and/or the hole transport layers in them may be different from each other, and the materials and thicknesses of the remaining film layers are the same.

During specific implementation, in the above display apparatus provided by an embodiment of the present disclosure, as shown in FIG. 16 and FIG. 17, the red quantum dot light-emitting device 200 may include: the second cathode 11 and the second anode 16 opposite to each other, a red quantum dot light-emitting layer 13 between the second cathode 11 and the second anode 16, a second electron transport layer 12 between the second cathode 11 and the red quantum dot light-emitting layer 13, a second hole transport layer 14 between the red quantum dot light-emitting layer 13 and the second anode 16, and a second hole injection layer 15 between the second anode 16 and the second hole transport layer 14. A material of the second electron transport layer 12 and a material of the first electron transport layer may both include oxides containing Zn.

During specific implementation, in the above display apparatus provided by an embodiment of the present disclosure, as shown in FIG. 16 and FIG. 17, the blue quantum dot light-emitting device 400 may include: the third cathode 21 and the third anode 26 opposite to each other, a blue quantum dot light-emitting layer 23 between the third cathode 21 and the third anode 26, a third electron transport layer 22 between the third cathode 21 and the blue quantum dot light-emitting layer 23, a third hole transport layer 24 between the blue quantum dot light-emitting layer 23 and the third anode 26, and a third hole injection layer 25 between the third anode 26 and the third hole transport layer 24. A material of the third electron transport layer 22 and the material of the first electron transport layer may both include oxides containing Zn.

During specific implementation, due to the different light-emitting wavelengths corresponding to the red, green and blue quantum dot materials, $I(\lambda, \theta)$ in the aforementioned cavity model changes with the wavelength. Therefore, when the wavelength changes, the best light emitting effect may be achieved by adjusting a distance between the top electrode and the bottom electrode. Therefore, in the above display apparatus provided by the embodiment of the present disclosure, as shown in FIG. 20 and FIG. 21, a sum of the thickness of the second electron transport layer 12 and the thickness of the second hole transport layer 14, a sum of the thickness of the first electron transport layer 4 and the thickness of the first hole transport layer 5, and a sum of the thickness of the third electron transport layer 22 and the thickness of the third hole transport layer 24 may be set to gradually decrease.

In one possible implementation, in the above display apparatus provided by the embodiment of the present disclosure, as shown in FIG. 20 and FIG. 21, a thickness of the second electron transport layer 12, a thickness of the first electron transport layer 4, and a thickness of the third electron transport layer 22 gradually decrease; and/or a thickness of the second hole transport layer 14, a thickness of the first hole transport layer 5, and a thickness of the third hole transport layer 24 gradually decrease.

FIG. 20 and FIG. 21 of the present invention takes an example that the thickness of the second electron transport layer 12, the thickness of the first electron transport layer 4, and the thickness of the third electron transport layer 22 gradually decrease, and the thickness of the second hole transport layer 14, the thickness of the first hole transport layer 5, and the thickness of the third hole transport layer 24 gradually decrease.

In one possible implementation, in the above display apparatus provided by the embodiment of the present disclosure, the thickness of the second electron transport layer 12 is in a range of 35 nm to 60 nm, and the thickness of the second hole transport layer 14 is in a range of 35 nm to 65 nm.

In one possible implementation, in order to further improve a light-emitting intensity of the red quantum dot light-emitting device in the normal direction, in the above display apparatus provided by the embodiment of the present disclosure, the thickness of the second electron transport layer is preferably in a range of 37.5 nm to 42.5 nm, and the thickness of the second hole transport layer is preferably in a range of 42.5 nm to 47.5 nm.

In one possible implementation, in the above display apparatus provided by the embodiment of the present disclosure, the thickness of the third electron transport layer 22 is in a range of 10 nm to 30 nm, and the thickness of the third hole transport layer 24 is in a range of 10 nm to 30 nm.

In one possible implementation, in order to further improve the light-emitting intensity of the blue quantum dot light-emitting device in the normal direction, in the above display apparatus provided by the embodiment of the present disclosure, the thickness of the third electron transport layer 22 is preferably in a range of 15 nm to 25 nm, and the thickness of the third hole transport layer 24 is preferably in a range of 10 nm to 20 nm.

The light-emitting wavelength of the red quantum dot materials is in a range of 610 nm-645 nm, and the commonly used red light wavelength is in a range of 620 nm to 635 nm; and the light-emitting wavelength of the blue quantum dot materials is in a range of 440 nm to 490 nm, and the commonly used blue light wavelength is in a range of 450 nm to 470 nm.

During specific implementation, the above display apparatus provided by the embodiment of the present disclosure, as shown in FIG. 20 and FIG. 21, may further include a pixel definition layer 500, and the pixel definition layer 500 has a pixel opening exposing a plurality of light-emitting regions.

During specific implementation, the above display apparatus provided by the embodiment of the present disclosure may further include other film layers well known to those skilled in the art, which is described in detail here.

The display apparatus may be: any product or component with a display function, such as a mobile phone, a tablet computer, a television, a displayer, a notebook computer, a digital photo frame, and a navigator. It should be understood by a person of ordinary skill in the art that the display apparatus should have other essential constituent parts, which is not repeated here and should not be regarded as limitation to the present invention. Principles of the display apparatus for solving the problems are similar to that of the aforementioned green quantum dot light-emitting device, therefore, implementation of the display apparatus may refer to that of the aforementioned green quantum dot light-emitting device, and repetitions are omitted.

According to the above green quantum dot light-emitting device, the method for manufacturing the same and the display apparatus provided by the embodiment of the present disclosure, the material for manufacturing the first electron transport layer adopts the oxide containing Zn, the thickness of the first electron transport layer is preferably in a range of 10 nm to 40 nm, and the thickness of the first hole transport layer is preferably in a range of 26 nm to 39 nm. In the present disclosure, by optimizing the thicknesses of the first electron transport layer and the first hole transport layer, a current efficiency of the green quantum dot light-emitting device is improved, and the front-side light emitting intensity of the green quantum dot light-emitting device is improved, the light-emitting angle distribution is narrowed, and the light-emitting intensity is concentrated on the front side of a screen (i.e. in the normal direction of the screen).

Although the preferred embodiments of the present disclosure have been described, those skilled in the art may make additional modifications and variations on these embodiments once they know the basic creative concept. Therefore, the appended claim intends to be explained as including the preferred embodiments and all modifications and variations falling within the scope of the present disclosure.

Obviously, those skilled in the art may make various modifications and variations to the embodiment of the present disclosure without departing from the spirit and scope of the embodiment of the present disclosure. In this way, if these modifications and variations of the embodiments of the present disclosure fall within the scope of the claims of the present disclosure and their equivalent art, the present disclosure also intends to include these modifications and variations.

What is claimed is:

1. A display apparatus, comprising a red quantum dot light-emitting device, a green quantum dot light-emitting device and a blue quantum dot light-emitting device, wherein the green quantum dot light-emitting device comprises:
    a first cathode and a first anode opposite to each other;
    a green quantum dot light-emitting layer between the first cathode and the first anode;
    a first electron transport layer between the first cathode and the green quantum dot light-emitting layer; and
    a first hole transport layer between the green quantum dot light-emitting layer and the first anode;
    wherein a material of the first electron transport layer comprises an oxide containing Zn, a thickness of the first electron transport layer is in a range of 10 nm to 40 nm, and a thickness of the first hole transport layer is in a range of 26 nm to 39 nm.

2. The display apparatus according to claim 1, wherein the red quantum dot light-emitting device comprises:
    a second cathode and a second anode opposite to each other;
    a red quantum dot light-emitting layer between the second cathode and the second anode;
    a second electron transport layer between the second cathode and the red quantum dot light-emitting layer; and
    a second hole transport layer between the red quantum dot light-emitting layer and the second anode;
    wherein the blue quantum dot light-emitting device comprises:
    a third cathode and a third anode opposite to each other;
    a blue quantum dot light-emitting layer between the third cathode and the third anode;
    a third electron transport layer between the third cathode and the blue quantum dot light-emitting layer; and a third hole transport layer between the blue quantum dot light-emitting layer and the third anode.

3. The display apparatus according to claim 2, wherein a sum of a thickness of the second electron transport layer and a thickness of the second hole transport layer, a sum of a thickness of the first electron transport layer and a thickness of the first hole transport layer, and a sum of a thickness of the third electron transport layer and a thickness of the third hole transport layer gradually decrease.

4. The display apparatus according to claim 2, wherein a thickness of the second electron transport layer, the thickness of the first electron transport layer, and a thickness of the third electron transport layer gradually decrease; and/or
a thickness of the second hole transport layer, a thickness of the first hole transport layer, and a thickness of the third hole transport layer gradually decrease.

5. The display apparatus according to claim 2, wherein a thickness of the second electron transport layer is in a range of 35 nm to 60 nm, and a thickness of the second hole transport layer is in a range of 35 nm to 65 nm.

6. The display apparatus according to claim 2, wherein a thickness of the second electron transport layer is in a range of 37.5 nm to 42.5 nm, and a thickness of the second hole transport layer is in a range of 42.5 nm to 47.5 nm.

7. The display apparatus according to claim 2, wherein a thickness of the third electron transport layer is in a range of 10 nm to 30 nm, and a thickness of the third hole transport layer is in a range of 10 nm to 30 nm.

8. The display apparatus according to claim 2, wherein a thickness of the third electron transport layer is in a range of 15 nm to 25 nm, and a thickness of the third hole transport layer is in a range of 10 nm to 20 nm.

9. The display apparatus according to claim 1, wherein:
the first cathode comprises a reflective film layer, and the first anode comprises a transflective film layer; or
the first cathode comprises a transflective film layer, and the first anode comprises a reflective film layer;
wherein the green quantum dot light-emitting device is provided with a top emission structure, the green quantum dot light-emitting device is provided with an inverted structure, and the green quantum dot light-emitting device further comprises a substrate on one side of the first cathode away from the green quantum dot light-emitting layer.

10. The display apparatus according to claim 1, wherein the thickness of the first electron transport layer is 30 nm, and the thickness of the first hole transport layer is 30 nm.

11. The display apparatus according to claim 1, wherein the material of the first electron transport layer is $Zn_{1-x}Mg_xO$, wherein x is in a range of 0 to 0.2.

12. The display apparatus according to claim 11, wherein x is equal to 0.15.

13. The display apparatus according to claim 1, wherein a material of the first hole transport layer comprises an organic material or an inorganic material;
wherein the organic material comprises polyvinylcarbazole, or poly(9,9-dioctylfluorene-alt-N-(4-sec-butylphenyl)-diphenylamine), or N,N'-diphenyl-N,N'-bis(3-methylbenzene)-(1,1'-biphenyl)-4,4'-diamine, or 4,4',4''-tris(carbazol-9-yl)triphenylamine, or N, N'-diphenyl-N, N'-bis(1-naphthyl)-1,1'-biphenyl-4-4'-diamine; and the inorganic material comprises NiOx or VOx.

14. The display apparatus according to claim 1, wherein the first hole transport layer comprises a first sub hole transport layer and a second sub hole transport layer laminated with each other, the first sub hole transport layer is close to the green quantum dot light-emitting layer in distance, the second sub hole transport layer is away from the green quantum dot light-emitting layer, and a highest occupied molecular orbit (HOMO) energy level of the first sub hole transport layer is smaller than an HOMO energy level of the second sub hole transport layer.

15. The display apparatus according to claim 14, wherein the HOMO energy level of the first sub hole transport layer is in a range of −5.5 eV to −6.2 eV, and the HOMO energy level of the second sub hole transport layer is in a range of −5.3 eV to −5.0 eV.

16. The display apparatus according to claim 15, wherein a thickness of the first sub hole transport layer is in a range of 4 nm to 15 nm, and a thickness of the second sub hole transport layer is in a range of 20 nm to 35 nm.

17. The display apparatus according to claim 1, wherein the green quantum dot light-emitting device further comprises:
a first hole injection layer between the first hole transport layer and the first anode, and a thickness of the first hole injection layer is in a range of 1 nm to 10 nm.

18. The display apparatus according to claim 17, wherein the thickness of the first hole injection layer is 5 nm.

19. The display apparatus according to claim 1, wherein a thickness of the green quantum dot light-emitting layer is in a range of 10 nm to 40 nm.

20. The display apparatus according claim 1, wherein the green quantum dot light-emitting device further comprises:
a light extraction layer on one side of the first anode away from the green quantum dot light-emitting layer, a material of the light extraction layer is an organic material, and a thickness of the light extraction layer is in a range of 60 nm to 130 nm.

* * * * *